United States Patent
Straßner et al.

(10) Patent No.: US 8,247,574 B2
(45) Date of Patent: *Aug. 21, 2012

(54) USE OF PT -AND PD-BIS- AND TETRA-CARBON COMPLEXES WITH BRIDGED CARBON LIGANDS IN OLEDS

(75) Inventors: Thomas Straßner, Dresden (DE); Yvonne Unger, Gravenwiesbach (DE); Alexander Zeller, Dormshadt (DE)

(73) Assignee: BASF SE, Ludwigshafen (DE)

( * ) Notice: Subject to any disclaimer, the term of this patent is extended or adjusted under 35 U.S.C. 154(b) by 586 days.

This patent is subject to a terminal disclaimer.

(21) Appl. No.: 12/306,533

(22) PCT Filed: Jun. 25, 2007

(86) PCT No.: PCT/EP2007/056331
§ 371 (c)(1),
(2), (4) Date: Apr. 3, 2009

(87) PCT Pub. No.: WO2008/000726
PCT Pub. Date: Jan. 3, 2008

(65) Prior Publication Data
US 2009/0326237 A1 Dec. 31, 2009

(30) Foreign Application Priority Data
Jun. 26, 2006 (EP) .................... 06116100

(51) Int. Cl.
*C07F 15/00* (2006.01)
(52) U.S. Cl. ....................... 548/103
(58) Field of Classification Search .............. 548/103
See application file for complete search history.

(56) References Cited

U.S. PATENT DOCUMENTS

| | | | |
|---|---|---|---|
| 2006/0258043 | A1 | 11/2006 | Bold et al. |
| 2007/0282076 | A1 | 12/2007 | Bold et al. |
| 2008/0018221 | A1 | 1/2008 | Egen et al. |
| 2011/0034699 | A1* | 2/2011 | Fuchs et al. ............... 548/103 |

FOREIGN PATENT DOCUMENTS

| | | |
|---|---|---|
| DE | 10 2004 040 005 A1 | 2/2006 |
| DE | 10 2004 057 072 A1 | 6/2006 |
| DE | 10 2005 058 206 A1 | 6/2006 |
| WO | WO 2005/019373 A2 | 3/2005 |
| WO | WO 2005/113704 A2 | 12/2005 |
| WO | WO 2005113704 A2 * | 12/2005 |
| WO | WO 2006/058535 A1 | 6/2006 |

OTHER PUBLICATIONS

Carol A. Quezada, et al., "Synthesis and structural characterization of two bis(imidazol-2-ylidene) complexes of Pt(II)", Journal of Organometallic Chemistry, vol. 671, 2003, pp. 183-186.
Marion Heckenroth, et al., "Synthesis and structural analysis of palladium biscarbene complexes derived from bisimidazolium ligand precursors", Inorganica Chimica Acta, vol. 359, 2006, pp. 1929-1938.
Wen-Mei Xue, et al., "Spectroscopic and Excited-State Properties of Luminescent Rhenium(I) N-Heterocyclic Carbene Complexes Containing Aromatic Diimine Ligands", Organometallics, vol. 17, XP-002309657, 1998, pp. 1622-1630.
Siu-Wai Lai, et al., "Luminescent metal complexes derived from carbene and related ligands: tuning excited-state properties with metal —carbon multiple bonds", Journal of Organometallic Chemistry, vol. 617-618, XP-004315036, Jan. 15, 2001, pp. 133-140.
Qing-Xiang Liu, et al., "Synthesis, crystal structure and photophysical properties of N-heterocyclic carbene Pd(II), Pt(II) complexes and iodine adduct", Polyhedron, vol. 22, XP-002309655, Jun. 15, 2003, pp. 1515-1521.

* cited by examiner

*Primary Examiner* — Joseph Kosack
(74) *Attorney, Agent, or Firm* — Oblon, Spivak, McClelland, Maier & Neustadt, L.L.P.

(57) ABSTRACT

The use of Pt- and Pd-bis- and tetracarbene complexes with bridged carbene ligands in organic light-emitting diodes, organic light-emitting diodes comprising at least one aforementioned Pt- or Pd-carbene complex, at least one transition metal-carbene complex of the general formula I and/or II, organic light-emitting diodes where the at least one transition metal-carbene complex of the general formula I and/or II is present in the light-emitting layer, a blocking layer for electrons, a blocking layer for excitons and/or a blocking layer for holes, a light-emitting layer comprising at least one aforementioned Pt- or Pd-carbene complex, organic light-emitting diodes comprising at least one inventive light-emitting layer, and devices which comprise at least one inventive organic light-emitting diode.

9 Claims, No Drawings

USE OF PT- AND PD-BIS- AND TETRA-CARBON COMPLEXES WITH BRIDGED CARBON LIGANDS IN OLEDS

The present invention relates to the use of Pt- and Pd-bis- and tetracarbene complexes with bridged carbene ligands in organic light-emitting diodes, to organic light-emitting diodes comprising at least one aforementioned Pt- or Pd-carbene complex, to organic light-emitting diodes where the at least one transition metal-carbene complex of the general formula I and/or II is present in the light-emitting layer, a blocking layer for electrons, a blocking layer for excitons and/or a blocking layer for holes, to a light-emitting layer comprising at least one aforementioned Pt- or Pd-carbene complex, to organic light-emitting diodes comprising at least one inventive light-emitting layer and to devices which comprise at least one inventive organic light-emitting diode.

In organic light-emitting diodes (OLEDs), the property of materials to emit light when they are excited by electrical current is exploited. OLEDs are of interest especially as an alternative to cathode ray tubes and liquid-crystal displays for the production of flat visual display units. Owing to the very compact design and the intrinsically low electricity consumption, the devices comprising OLEDs are especially suitable for mobile applications, for example for uses in cellphones, laptops, etc.

The basic principles of the functioning of OLEDs and suitable assemblies (layers) of OLEDs are specified, for example, in WO 2005/113704 and the literature cited therein.

The prior art has already proposed numerous materials which emit light on excitation by electrical current.

WO 2005/019373 for the first time discloses the use of uncharged transition metal complexes which comprise at least one carbene ligand in OLEDs. According to WO 2005/019373, these transition metal complexes can be used in any layer of an OLED, the ligand structure or central metal being variable for adjustment to desired properties of the transition metal complexes. For example, the use of the transition metal complexes in a blocking layer for electrons, a blocking layer for excitons, a blocking layer for holes, or the light-emitting layer of the OLED is possible, preference being given to using the transition metal complexes as emitter molecules in OLEDs.

WO 2005/113704 relates to luminescent compounds which bear carbene ligands. WO 2005/113704 specifies numerous transition metal complexes with different carbene ligands, preference being given to using the transition metal complexes as phosphorescent light-emitting material, more preferably as a doping substance.

Both the transition metal-carbene complexes disclosed in WO 2005/019373 and those disclosed in WO 2005/113704 have carbene ligands which are bonded to the transition metal atom by cyclometalation. The carbene ligand(s) is/are bonded to the transition metal firstly via the carbene carbon atom and secondly via a further carbon atom or heteroatom.

With respect to the aforementioned prior art, it is an object of the present invention to provide further transition metal-carbene complexes for use in OLEDs, which exhibit a balanced property spectrum, for example good stability, good efficiencies and/or improved lifetime.

This object is achieved by the use of transition metal-carbene complexes selected from transition metal-carbene complexes of the general formulae (I) and (II) in organic light-emitting diodes.

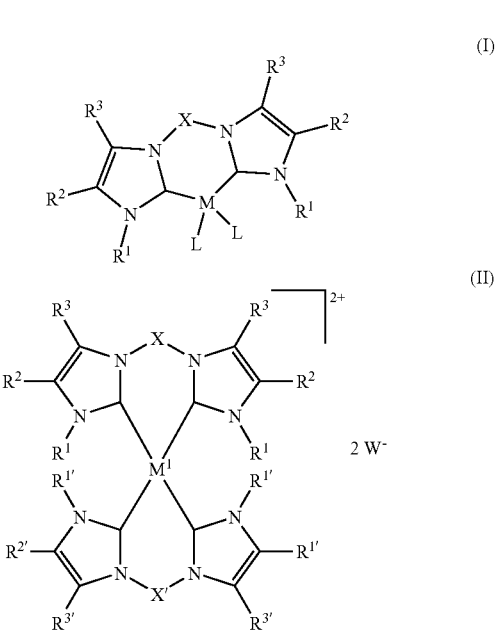

in which the symbols are each defined as follows:
$M^1$ is Pt(II), Pd(II);
L is a monodentate monoanionic ligand;
$R^1, R^{1'}$
  are each independently hydrogen, alkyl, cycloalkyl, aryl, heteroaryl, aralkyl;
$R^2, R^3, R^{2'}, R^{3'}$
  are each independently hydrogen, alkyl, aryl;
X, X are each independently alkylene,

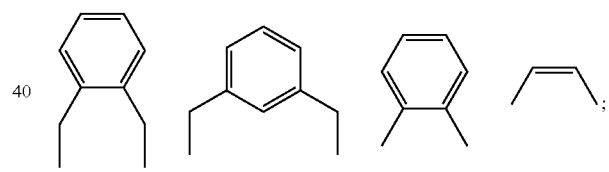

$W^-$ is a monoanionic counterion.

The aforementioned transition metal-carbene complexes of the general formulae I and II used in accordance with the invention do not have any cyclometalation of the carbene ligands via a further carbon atom or heteroatom. It has been found that, surprisingly, sufficiently stable transition metal-carbene complexes suitable for use in OLEDs can be provided without a cyclometalation of the carbene ligand(s) via a further carbon atom or heteroatom being required.

If different isomers of the transition metal-carbene complexes of the formulae I or II used in accordance with the invention may be present, the present invention comprises both the individual isomers of the transition metal-carbene complexes of the formula I in each case and mixtures of different isomers in any mixing ratio. In general, different isomers of the metal complexes of the formulae I and II can be separated by processes known to those skilled in the art, for example by chromatography, sublimation or crystallization.

The transition metal-carbene complexes of the formulae I and II may be used in any layer of an OLED, and the ligand structure or central metal can be varied for adjustment to desired properties of the metal complexes. For example, the use of the transition metal-carbene complexes of the formulae (I) and (II) in a blocking layer for electrons, a blocking layer for excitons, a blocking layer for holes or the light-emitting layer of the OLED is possible. Preference is given to using the compounds of the formulae (I) and (II) as emitter molecules in OLEDs.

A monodentate ligand is understood to mean a ligand which is coordinated to the transition metal atom $M^1$ at one site on the ligand.

Transition metal-carbene complexes which have exclusively a bond of the carbene ligand(s) to the transition metal atom via carbene carbon atoms are known in the prior art.

W. J. Youngs et al., J. Organomet. Chem. 671 (2003) 183 to 186 relates to the synthesis and structural characterization of two bis(imidazol-2-ylidene)-Pt(II) complexes. However, a use of these complexes is not specified.

M. Albrecht et al., Inorganica Chimica Acta (2006), 1929-1938 relates to the synthesis and structural analysis of palladium-biscarbene complexes which bear bisimidazolium ligands. In particular, M. Albrecht et al. relates to mechanistic analyses of the metalation of the bisimidazolium ligand.

Ch.-M. Che et al., Organometallics 1998, 17, 1622 to 1630 relates to an analysis of the spectroscopic properties of luminescent rhenium(I)-N-heterocyclic carbene complexes which bear aromatic photoactive diimine ligands. The analysis of the spectroscopic properties of the complexes serves for a better understanding of the electronic conditions in these complexes. A use of the N-heterocyclic rhenium(I)-carbene complexes and possible electroluminescent properties are not reported in Ch.-M. Che.

In addition, DE-A 10 2005 058 206 discloses N-heterocyclic biscarbene complexes of platinum and of palladium, their preparation and their use as a catalyst, especially as a catalyst for the partial oxidation of hydrocarbons or hydrocarbon-containing charges. DE-A 10 2005 058 206 does not comprise any information regarding the luminescence properties of the complexes disclosed.

The suitability of transition metal-carbene complexes of the formulae I and II according to the present invention for use in OLEDs is not mentioned in any of the aforementioned documents. It has thus been found that the transition metal-carbene complexes of the formulae I and II according to the present application are suitable for use in OLEDs.

Suitable monoanionic ligands L which are monodentate are the ligands which are typically used as monodentate monoanionic ligands.

Typically, the ligands L used are non-photoactive ligands. Suitable ligands L are halides, especially Cl⁻, Br⁻, I⁻, pseudohalides, especially CN⁻, and alkoxy and OAc⁻; preferred ligands L are Br⁻, I⁻ and OAc⁻.

Suitable monoanionic counterions W⁻ are, for example, halides, especially Cl⁻, Br⁻, I⁻, pseudohalides, especially CN⁻, alkoxy, OAc⁻, $BF_4^-$, $PF_6^-$, $SbF_6^-$, $AsF_6^-$, SCN⁻, OCN⁻ and $ClO_4^-$; preferred monoanionic counterions are Br⁻ and I⁻.

In the context of the present application, the terms aryl radical or group, alkyl radical or group, cycloalkyl radical or group, aralkyl radical or group, alkoxy radical or group are each defined as follows:

An aryl radical (or group) is understood to mean a radical with a base structure of from 6 to 18 carbon atoms, which is formed from an aromatic ring or a plurality of fused aromatic rings. Suitable base structures are, for example, phenyl, naphthyl, anthracenyl or phenanthrenyl. This base structure may be unsubstituted (i.e. all carbon atoms which are substitutable bear hydrogen atoms) or be substituted at one, more than one or all substitutable positions of the base structure. Suitable substituents are, for example, alkyl radicals, preferably alkyl radicals having from 1 to 8 carbon atoms, more preferably methyl, ethyl or i-propyl. The aryl radical is preferably a $C_6$-aryl radical, which is optionally substituted by at least one of the aforementioned substituents. The $C_6$-aryl radical more preferably has one, two or three alkyl radicals, where one substituent is arranged in the ortho, meta or para position to the further bonding site of the aryl radical, and—in the case of two substituents—they may each be arranged in the meta position or ortho position to the further bonding site of the aryl radical, or one radical is arranged in the ortho position and one radical in the meta position, or one radical is arranged in the ortho or meta position and the further radical is arranged in the para position. In the case of three substituents, they are preferably arranged in the ortho position (two of the three substituents) and p-position (third substituent) to the further bonding site of the aryl radical.

An alkyl radical or an alkyl group is understood to mean a radical having from 1 to 8 carbon atoms, preferably from 1 to 4 carbon atoms. This alkyl radical may be branched or unbranched. The alkyl radicals are more preferably selected from the group consisting of methyl, ethyl, isopropyl, n-propyl, n-butyl, isobutyl and tert-butyl; very particular preference is given to methyl, isopropyl and n-butyl.

An alkoxy radical or an alkoxy group is understood to mean an O-alkyl radical. Suitable alkyl radicals are specified above.

A cycloalkyl radical or a cycloalkyl group is understood to mean a radical having from 3 to 8 carbon atoms. This base structure may be unsubstituted (i.e. all carbon atoms which are substitutable bear hydrogen atoms) or be substituted at one, more than one or all substitutable positions of the base structure. Suitable substituents are the groups already mentioned above for the aryl radicals. Particular preference is given to cyclohexyl.

An aralkyl radical (or group) is understood to mean a radical having a base structure of from 6 to 18 carbon atoms, which may be unsubstituted or substituted by the radicals mentioned for the aryl groups. The aralkyl group is preferably benzyl.

In the context of the present application, the term alkylene is as defined for the alkyl radicals, with the difference that the alkylene group has two binding sites to the nitrogen atoms of the biscarbene ligands in the transition metal-carbene complexes of the formulae I and II. Preferred alkylene groups are $(CR^4_2)_n$ where $R^4$ is H or alkyl, preferably H, methyl or ethyl, more preferably H, and n is from 1 to 3, preferably 1 or 2, more preferably 1. Most preferably, the alkylene group is $CH_2$.

When radicals with the same numberings occur more than once in the compounds according to the present application, these radicals may each independently be defined as specified.

The symbols and radicals $R^1$, $R^2$, $R^3$, $R^{1'}$, $R^{2'}$, $R^{3'}$, X, X', $M^1$, L and W⁻ in the transition metal-carbene complexes of the formulae I and II are preferably each defined as follows:

$M^1$ is Pt(II), Pd(II), preferably Pt(II);

L is a monodentate monoanionic ligand, preferably selected independently from halides, pseudohalides and alkoxy, OAc⁻, more preferably Cl⁻, Br⁻, I⁻, CN⁻ or OAc⁻, most preferably OAc⁻, Br⁻ or I⁻;

$R^1$, $R^{1'}$ are each independently hydrogen, alkyl, cycloalkyl, aryl, aralkyl, preferably $C_1$-$C_4$-alkyl, cyclohexyl, 2,4,6-trimethylphenyl or benzyl, more preferably methyl, isopropyl, n-butyl;

$R^2$, $R^3$, $R^{2'}$, $R^{3'}$
are each independently hydrogen or alkyl, preferably hydrogen;

X, X' are each independently alkylene or

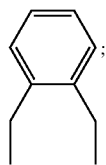

preferably $(CR^4{}_2)_n$,

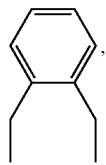

where $R^4$ is H, alkyl, preferably H, methyl or ethyl, more preferably H, and n is from 1 to 3, preferably 1 or 2, more preferably 1, most preferably $CH_2$,

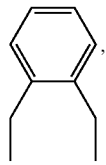

especially preferably $CH_2$;

$W^-$ is a monoanionic counterion, preferably halide, pseudohalide or $OAc^-$, more preferably $Cl^-$, $Br^-$, $I^-$, $CN^-$, $OAc^-$, most preferably $Br^-$ or $I^-$.

In one embodiment, the present application relates to the use of Pt- and Pd-biscarbene complexes of the general formula (I)

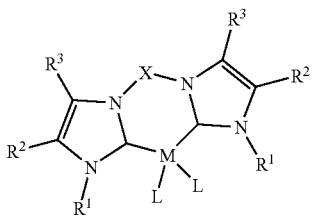

in which:
$M^1$ is Pt(II), Pd(II);
X is $CH_2$ or

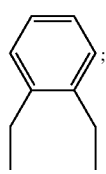

$R^1$ are each independently $C_1$-$C_4$-alkyl, cyclohexyl, 2,4,6-trimethylphenyl or benzyl, preferably methyl, isopropyl, n-butyl, cyclohexyl, 2,4,6-trimethyl-phenyl or benzyl;

$R^2$, $R^3$
are each independently hydrogen or alkyl, preferably hydrogen;

L are each independently selected from halides, pseudohalides and $OAc^-$, preferably $Cl^-$, $Br^-$, $I^-$, $CN^-$ or $OAc^-$, more preferably $Br^-$, $I^-$ or $OAc^-$.

$R^1$, $R^2$ and $R^3$ in the biscarbene complex of the formula I preferably each have the same definitions, so that the biscarbene ligand is symmetrical.

In a further embodiment, the present invention relates to tetracarbene complexes which bear two biscarbene ligands. The tetracarbene complexes may be homoleptic tetracarbene complexes, i.e. the two biscarbene ligands in the homoleptic tetracarbene complexes are identical. However, they may also be heteroleptic tetracarbene complexes, i.e. the two biscarbene ligands in the heteroleptic tetracarbene complexes are not identical.

The tetracarbene complexes used according to the present application have the general formula (II)

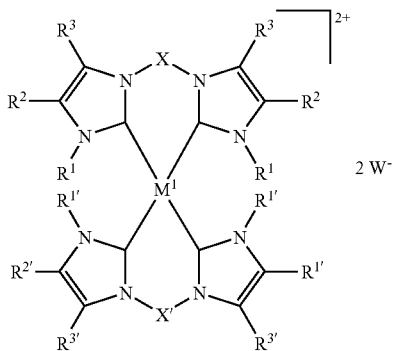

in which:
$M^1$ is Pt(II), Pd(II);
X, X'
are each independently alkylene or

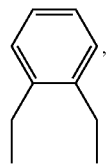

preferably alkylene, more preferably $(CR^4{}_2)_n$ where $R^4$ is H, alkyl, preferably H, methyl or ethyl, more preferably H, and n is from 1 to 3, preferably 1 or 2, more preferably 1, most preferably $CH_2$;

$R^1$, $R^{1'}$
are each independently hydrogen, alkyl, cycloalkyl, aryl, aralkyl, preferably hydrogen, $C_1$-$C_4$-alkyl, cyclohexyl, 2,4,6-trimethylphenyl or benzyl, more preferably methyl, isopropyl, n-butyl, cyclohexyl, benzyl, 2,4,6-trimethyl-phenyl;

$R^2$, $R^3$, $R^{2'}$, $R^{3'}$
are each hydrogen or alkyl, preferably hydrogen;
$W^-$ is halide, pseudohalide or $OAc^-$, preferably $Cl^-$, $Br^-$, $I^-$, $CN^-$, $OAc^-$, most preferably $Br^-$ or $I^-$.

In the homoleptic tetracarbene complexes of the formula II, the symbols are most preferably each defined as follows:

$M^1$ Pt(II);
X, X' are each $CH_2$;
$R^1, R^{1'}$
  are each $CH_3$, isopropyl, n-butyl or cyclohexyl;
$R^2, R^3, R^{2'}, R^{3'}$
  are each hydrogen;
$W^-$ is $I^-$ or $Br^-$.

In the heteroleptic tetracarbene complexes of the formula II, the symbols and radicals are most preferably each defined as follows:

$M^1$ is Pt(II);
X, X' are each $CH_2$;
$R^1, R^{1'}$
  are each independently $CH_3$, isopropyl, n-butyl, cyclohexyl, benzyl or 2,4,6-trimethylphenyl, where $R^1$ and $R^{1'}$ are each defined as follows;
$R^2, R^3, R^{2'}, R^{3'}$
  are each hydrogen;
$W^-$ is $I^-$ or $Br^-$.

The transition metal-carbene complexes of the formulae I and II used in accordance with the invention may in principle be prepared by processes known to those skilled in the art or analogously to processes known to those skilled in the art. Suitable general processes for preparing carbene complexes are detailed, for example, in the review articles W. A. Hermann et al., Advances in Organometallic Chemistry, 2001, Vol. 48, 1 to 69, W. A. Hermann et al., Angew. Chem. 1997, 109, 2256 to 2282 and G. Bertrand et al., Chem. Rev. 2000, 100, 39 to 91 and the literature cited therein. Further preparation processes are specified, for example, in Ch.-M. Che et al., Organometallics 1998, 17, 1622 to 1630, M. Albrecht et al., Inorganica Chimica Acta 359 (2006) 1929-1938 and W. J. Youngs et al., J. Organomet. Chem. 671 (2003) 183 to 186, and in DE-A 10 2005 058 206.

Typically, the transition metal-carbene complexes of the formulae I and II are prepared from the precursors corresponding to the carbene ligands and suitable metal complexes comprising the desired metal.

Suitable ligand precursors of the carbene ligands of the transition metal-carbene complexes used in accordance with the invention are bisimidazolium salts of the general formula III

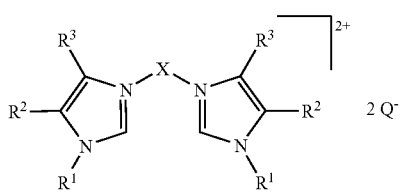

in which
$Q^-$ is a monoanionic counterion, preferably halides, especially $Cl^-$, $Br^-$, $I^-$, pseudohalides, especially $CN^-$, alkoxy, $OAc^-$, $BF_4^-$, $PF_6^-$, $SbF_6^-$, $ASF_6^-$, $SCN^-$, $OCN^-$ and $ClO_4^-$; preferred monoanionic counterions are $Br^-$ and $I^-$.

The bisimidazolium salts of the formula III can be prepared by processes known to those skilled in the art or analogously to processes known to those skilled in the art. Suitable processes are specified, for example, in M. Albrecht et al., Organometallics 2002, 21, (17), 3596 to 3604, G. Maletz et al., "Palladium or Platinum Carbene Complexes as Catalyst for Partial Oxidation of Alkanes", 2001-10151660, 10151660, 20011019, 2003 and M. Muehlhofer et al., Journal of Organometallic Chemistry 2002, 660, (2), 121 to 126 and in DE-A 10 2005 058 206.

For example, the bisimidazolium salts of the formula III are obtainable by reacting the correspondingly substituted imidazoles with $CH_2Z_2$ where Z may be Cl, Br or I. The correspondingly substituted imidazoles can be prepared by processes known to those skilled in the art or are commercially available.

The suitable metal complexes comprising the desired metal are generally Pt(II)- or Pd(II)-metal complexes. Suitable metal complexes are known to those skilled in the art. Examples of suitable metal complexes are $Pt(acac)_2$ in which acac is acetylacetonate, $PtCl_2$, $Pt(OAc)_2$, $Pd(acac)_2$, $PdCl_2$, $Pd(OAc)_2$, $Pt(cod)Cl_2$ in which cod is cyclooctadiene.

The further conversion of the bisimidazolium salts to the desired transition metal-carbene complexes of the formulae I and II is dependent upon the desired transition metal-carbene complexes.

In the case that the desired transition metal-carbene complex is a biscarbene complex of the general formula I, the ligand precursor of the formula III used and the appropriate metal complex are used in a molar ratio of from 0.75:1 to 1:0.75, preferably from 0.9:1 to 1:0.9, more preferably 1:1.

In the case that the desired transition metal-carbene complex is a homoleptic transition metal-carbene complex of the formula II, it is possible firstly that a ligand precursor of the general formula III is reacted with a suitable metal complex in a molar ratio of generally from 3:1 to 2:1, preferably from 2.5:1 to 2:1, more preferably 2:1, to obtain the desired homoleptic tetracarbene complex of the formula II directly. Secondly, it is possible first to prepare a biscarbene complex by reacting a ligand precursor of the formula III with an appropriate metal complex in the aforementioned stoichiometric ratios suitable for preparing biscarbene complexes, and to react this resulting biscarbene complex, preferably in situ, without further workup, with further ligand precursor of the formula III, the molar ratio of the biscarbene complex preferably obtained in situ to the further ligand precursor being generally from 0.75:1 to 1:0.75, preferably from 0.9:1 to 1:0.9, more preferably 1:1.

The further reaction conditions for preparing the transition metal-carbene complexes of the general formulae I and II from the corresponding bisimidazolium salts (ligand precursors of the formula II) corresponding to reaction conditions according to processes known to those skilled in the art or analogously to processes known to those skilled in the art under reaction conditions known to those skilled in the art or analogously to reaction conditions known to those skilled in the art.

After the aforementioned reaction of the metal complex with one or more ligand precursors of the formula III, the resulting transition metal-carbene complex of the formulae I and II is worked up and, if appropriate, purified by processes known to those skilled in the art. Typically, workup and purification are effected by extraction, column chromatography and/or recrystallization by processes known to those skilled in the art.

The transition metal-carbene complexes of the formulae I and II are used in organic light-emitting diodes (OLEDs). In a preferred embodiment, the present application relates to the uses of transition metal-carbene complexes of the formula II. The transition metal-carbene complexes of the formulae I and II are suitable as emitter substances, since they have an emission (electroluminescence) in the visible region of the electromagnetic spectrum. With the aid of the transition metal-carbene complexes of the formulae I and II used in accordance with the invention as emitter substances, it is possible to provide compounds which exhibit electroluminescence in the entire range of the electromagnetic spectrum with good efficiency. At the same time, the quantum yield is high and the stability of the transition metal-carbene complexes of the formulae I and II used in accordance with the invention in the device is high.

In addition, the transition metal-carbene complexes of the formulae I and II used in accordance with the invention are suitable as electron, exciton or hole blockers, or hole conductors, electron conductors, hole injection layer or matrix material in OLEDs, depending on the ligands used and the central metal used.

Organic light-emitting diodes (OLEDs) are in principle composed of several layers:
1. Anode (1)
2. Hole-transporting layer (2)
3. Light-emitting layer (3)
4. Electron-transporting layer (4)
5. Cathode (5)

However, it is also possible that the OLED does not have all of the layers mentioned; for example an OLED having the layers (1) (anode), (3) (light-emitting layer) and (5) (cathode) is likewise suitable, in which case the functions of the layers (2) (hole-transporting layer) and (4) (electron-transporting layer) are assumed by the adjacent layers. OLEDs which have the layers (1), (2), (3) and (5), or the layers (1), (3), (4) and (5), are likewise suitable.

The transition metal-carbene complexes of the formulae I and II may be used in various layers of an OLED. The present invention therefore further provides an OLED comprising at least one transition metal-carbene complex of the formulae I and/or II. The at least one transition metal-carbene complex of the general formula I and/or II is preferably present in the light-emitting layer, a blocking layer for electrons, a blocking layer for excitons and/or a blocking layer for holes. The transition metal-carbene complexes of the formulae I and/or II are used preferably in the light-emitting layer, more preferably as emitter molecules. The present invention therefore further provides a light-emitting layer comprising at least one transition metal-carbene complex of the formulae I and II, preferably as an emitter molecule. Preferred transition metal-carbene complexes of the formulae I and II have been specified above.

The transition metal-carbene complexes of the formulae I and II used in accordance with the invention may be present in bulk—without further additives—in the light-emitting layer or another layer of the OLED, preferably in the light-emitting layer. However, it is likewise possible and preferred that, in addition to the transition metal-carbene complexes of the formulae I and/or II, further compounds are present in the layers, preferably in the light-emitting layer. For example, a fluorescent dye may be present in the light-emitting layer in order to alter the emission color of the transition metal-carbene complex of the formula I or II used as an emitter molecule. In addition—in a preferred embodiment—a diluent material may be used. This diluent material may be a polymer, for example poly(N-vinylcarbazole) or polysilane. However, the diluent material may likewise be a small molecule, for example 4, 4'-N,N'-dicarbazolebiphenyl (CDP=CBP) or tertiary aromatic amines.

The individual aforementioned layers of the OLED may in turn be composed of 2 or more layers. For example, the hole-transporting layer may be composed of one layer into which holes are injected from the electrode and one layer which transports the holes from the hole-injecting layer away into the light-emitting layer. The electron-transporting layer may likewise consist of a plurality of layers, for example one layer in which electrons are injected by the electrode and one layer which receives electrons from the electron-injecting layer and transports them into the light-emitting layer. These specified layers are each selected according to factors such as energy level, thermal resistance and charge carrier mobility, and also energy differential of the layers mentioned with the organic layers or the metal electrodes. Those skilled in the art are capable of selecting the structure of the OLED in such a way that it is adapted optimally to the transition metal-carbene complexes of the formulae I and II used in accordance with the invention, preferably as emitter substances.

In order to obtain particularly efficient OLEDs, the HOMO (highest occupied molecular orbital) of the hole-transporting layer should be aligned to the work function of the anode, and the LUMO (lowest unoccupied molecular orbital) of the electron-transporting layer aligned to the work function of the cathode.

The present application further provides an OLED comprising at least one inventive light-emitting layer. The further layers in the OLED may be composed of any material which is typically used in such layers and is known to those skilled in the art.

The anode (1) is an electrode which provides positive charge carriers. It may be composed, for example, of materials which comprise a metal, a mixture of different metals, a metal alloy, a metal oxide or a mixture of different metal oxides. Alternatively, the anode may be a conductive polymer. Suitable metals include the metals of groups 11, 4, 5 and 6 of the Periodic Table of the Elements, and also the transition metals of groups 8 to 10. When the anode is to be transparent, mixed metal oxides of groups 12, 13 and 14 of the Periodic Table of the Elements are generally used, for example indium tin oxide (ITO). It is likewise possible that the anode (1) comprises an organic material, for example polyaniline, as described, for example, in Nature, Vol. 357, pages 477 to 479 (Jun. 11, 1992). At least either the anode or the cathode should be at least partly transparent in order to be able to emit the light formed.

Suitable hole-transporting materials for the layer (2) of the inventive OLED are disclosed, for example, in Kirk-Othmer Encyclopedia of Chemical Technology, 4th Edition, Vol. 18, pages 837 to 860, 1996. Either hole-transporting molecules or polymers may be used as the hole-transporting material. Customarily used hole-transporting molecules are selected from the group consisting of 4,4'-bis[N-(1-naphthyl)-N-phenylamino]biphenyl (a-NPD), N,N'-diphenyl-N,N'-bis(3-methylphenyl)-[1,1'-biphenyl]-4,4'-diamine (TPD), 1,1-bis[(di-4-tolylamino)phenyl]-cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), 4,4',4"-tris(N,N-diphenylamino)triphenylamine (TDTA) and porphyrin compounds, and also phthalocyanines such as copper phthalocyanines. Customarily used hole-transporting polymers are selected from the group consisting of polyvinylcarbazoles, (phenylmethyl)polysilanes, PEDOT (poly(3, 4-ethylenedioxythiophene)), preferably PEDOT doped with PSS (polystyrenesulfonate), and polyanilines. It is likewise possible to obtain hole-transporting polymers by doping hole-transporting molecules into polymers such as polystyrene and polycarbonate. Suitable hole-transporting molecules are the molecules already mentioned above.

Suitable electron-transporting materials for the layer (4) of the inventive OLEDs include metals chelated with oxinoid compounds, such as tris(8-hydroxyquinolato)aluminum ($Alq_3$), compounds based on phenanthroline such as 2,9-dimethyl-4,7-diphenyl-1,10-phenanthroline (DDPA=BCP) or 4,7-diphenyl-1,10-phenanthroline (DPA) and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). The layer (4) may serve both to ease the electron transport and as a buffer layer or as a barrier layer in order to prevent quenching of the exciton at the interfaces of the layers of the OLED. The layer (4) preferably improves the mobility of the electrons and reduces quenching of the exciton.

Of the materials specified above as hole-transporting materials and electron-transporting materials, some can fulfill a plurality of functions. For example, some of the electron-conducting materials are simultaneously hole-blocking materials when they have a low-lying HOMO.

The charge transport layers may also be electronically doped in order to improve the transport properties of the materials used, in order firstly to make the layer thicknesses more generous (avoidance of pinholes/short circuits) and secondly to minimize the operating voltage of the device. For example, the hole-transporting materials may be doped with electron acceptors; for example, phthalocyanines or arylamines such as TPD or TDTA may be doped with tetrafluorotetracyanoquinodimethane (F4-TCNQ). The electron-transporting materials may, for example, be doped with alkali metals, for example $Alq_3$ with lithium. Electronic doping is known to those skilled in the art and is disclosed, for example, in W. Gao, A. Kahn, J. Appl. Phys., Vol. 94, No. 1, Jul. 1, 2003 (p-doped organic layers); A. G. Werner, F. Li, K. Harada, M. Pfeiffer, T. Fritz, K. Leo, Appl. Phys. Lett., Vol. 82, No. 25, Jun. 23, 2003 and Pfeiffer et al., Organic Electronics 2003, 4, 89-103.

The cathode (5) is an electrode which serves to introduce electrons or negative charge carriers. The cathode may be any metal or nonmetal which has a lower work function than the anode. Suitable materials for the cathode are selected from the group consisting of alkali metals of group 1, for example Li, Cs, alkaline earth metals of group 2, metals of group 12 of the Periodic Table of the Elements, comprising the rare earth metals and the lanthanides and actinides. In addition, metals such as aluminum, indium, calcium, barium, samarium and magnesium, and combinations thereof, may be used. In addition, lithium-comprising organometallic compounds or LiF may be applied between the organic layer and the cathode in order to reduce the operating voltage.

The OLED of the present invention may additionally comprise further layers which are known to those skilled in the art. For example, a layer which eases the transport of the positive charge and/or matches the band gaps of the layers to one another may be applied between the layer (2) and the light-emitting layer (3). Alternatively, this further layer may serve as a protective layer. In an analogous manner, additional layers may be present between the light-emitting layer (3) and the layer (4) in order to ease the transport of the negative charge and/or to match the band gaps between the layers to one another. Alternatively, this layer may serve as a protective layer.

In a preferred embodiment, the inventive OLED, in addition to the layers (1) to (5), comprises at least one of the further layers mentioned below:
  a hole injection layer between the anode (1) and the hole-transporting layer (2);
  a blocking layer for electrons and/or excitons between the hole-transporting layer (2) and the light-emitting layer (3);
  a blocking layer for holes and/or excitons between the light-emitting layer (3) and the electron-transporting layer (4);
  an electron injection layer between the electron-transporting layer (4) and the cathode (5).

As already mentioned above, it is, however, also possible that the OLED does not have all of the layers (1) to (5) mentioned; for example, an OLED having the layers (1) (anode), (3) (light-emitting layer) and (5) (cathode) is likewise suitable, in which case the functions of the layers (2) (hole-transporting layer) and (4) (electron-transporting layer) are assumed by the adjacent layers. OLEDs which have the layers (1), (2), (3) and (5) or the layers (1), (3), (4) and (5) are likewise suitable.

Those skilled in the art know how suitable materials have to be selected (for example on the basis of electrochemical investigations). Suitable materials for the individual layers and suitable OLED structures are known to those skilled in the art and disclosed, for example, in WO2005/113704.

Furthermore, each of the specified layers of the inventive OLED may be composed of two or more layers. In addition, it is possible that some or all of the layers (1), (2), (3), (4) and (5) have been surface-treated in order to increase the efficiency of charge carrier transport. The selection of the materials for each of the layers mentioned is preferably determined by obtaining an OLED having a high efficiency.

The inventive OLED can be produced by methods known to those skilled in the art. In general, the OLED is produced by successive vapor deposition of the individual layers onto a suitable substrate. Suitable substrates are, for example, glass or polymer films. For the vapor deposition, customary techniques may be used, such as thermal evaporation, chemical vapor deposition and others. In an alternative process, the organic layers may be coated from solutions or dispersions in suitable solvents, in which case coating techniques known to those skilled in the art are employed. Compositions which, in addition to the at least one transition metal-carbene complex of the formulae I and/or II, have a polymeric material in one of the layers of the OLED, preferably in the light-emitting layer, are generally applied as a layer by means of solution-mediated processes.

In general, the different layers have the following thicknesses: anode (1) from 500 to 5000 Å, preferably from 1000 to 2000 Å; hole-transporting layer (2) from 50 to 1000 Å, preferably from 200 to 800 Å; light-emitting layer (3) from 10 to 1000 Å, preferably from 100 to 800 Å; electron-transporting layer (4) from 50 to 1000 Å, preferably from 200 to 800 Å; cathode (5) from 200 to 10 000 Å, preferably from 300 to 5000 Å. The position of the recombination zone of holes and electrons in the inventive OLED and thus the emission spectrum of the OLED may be influenced by the relative thickness of each layer. This means that the thickness of the electron transport layer should preferably be selected such that the electron/hole recombination zone is within the light-emitting layer. The ratio of the layer thicknesses of the individual layers in the OLED is dependent upon the materials used. The layer thicknesses of any additional layers used are known to those skilled in the art.

Use of the transition metal-carbene complexes of the formulae I and/or II in at least one layer of the inventive OLED, preferably as emitter molecules in the light-emitting layer of the inventive OLEDs, allows OLEDs with high efficiency to be obtained. The efficiency of the inventive OLEDs may additionally be improved by optimizing the other layers. For example, highly efficient cathodes such as Ca, Ba or LiF may be used. Shaped substrates and novel hole-transporting materials which bring about a reduction in the operating voltage or an increase in the quantum efficiency are likewise usable in the inventive OLEDs. Furthermore, additional layers may be present in the OLEDs in order to adjust the energy level of the different layers and to ease electroluminescence.

The inventive OLEDs may be used in all devices in which electroluminescence is useful. Suitable devices are preferably selected from stationary and mobile visual display units. Stationary visual display units are, for example, visual display units of computers, televisions, visual display units in printers, kitchen appliances and advertising panels, illuminations and information panels. Mobile visual display units are, for example, visual display units in cellphones, laptops, cameras, in particular digital cameras, vehicles and destination displays on buses and trains.

In addition, the transition metal-carbene complexes of the formulae I and II may be used in OLEDs with inverse structure. The transition metal-carbene complexes of the general formulae (I) and (II) used in accordance with the invention are preferably used in these inverse OLEDs in turn in the light-emitting layer. The structure of inverse OLEDs and the materials customarily used therein are known to those skilled in the art.

The examples which follow additionally illustrate the invention:

EXAMPLES

1 Synthesis of aliphatic and aromatic N-substituted imidazoles

Methods:

The imidazoles produced here were prepared by means of the syntheses in the literature cited (Arduengo, A. J., et al., III Process for manufacture of imidazoles. 98-193700, 6177575, 19981117, 2001; Liu, J. et al., A modified procedure for the synthesis of 1-arylimidazoles. *Synthesis* 2003, (17), 2661-2666).

A) 1-$^{iso}$Propylimidazole 1

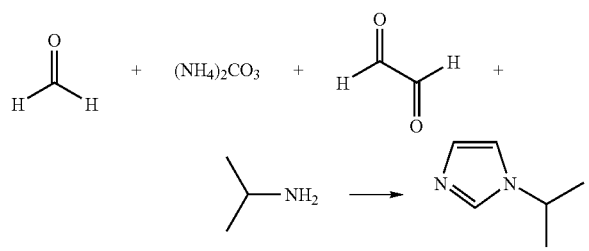

1.05 mol of paraformaldehyde (31.500 g) are initially charged in 120 ml of methanol. 1 mol of $^{iso}$propylamine (59.110 g, 85.67 ml) in 120 ml of methanol are cautiously added thereto with ice cooling. At a temperature of 0° C., 0.5 mol of ammonium carbonate (48.047 g) and 1 mol of 40% glyoxal solution (145.070 g, 114.7 ml) in 250 ml of methanol are added. Thereafter, the reaction mixture is warmed to room temperature and stirred overnight, in order that the carbon dioxide formed can escape. Ultimately, the solvent is removed and the product is distilled through a column under high vacuum.

Empirical formula: $C_6H_{10}N_2$ M=110.16 g/mol

Yield: 47.575 g (43.2% of theory)

$^1$H NMR (ppm, CDCl$_3$, 300.13 MHz):

δ=7.47 (s, 1H, NCHN); 6.97 (s, 1H, NCHCHN); 6.89 (s, 1H, NCHCHN); 4.27 (sept, 1H, J=6.7 Hz, ((CH$_3$)$_2$CHN); 1.40 (d, 6H, J=6.7 Hz, CH$_3$ group)

B) 1-$^{tert}$Butylimidazole 2

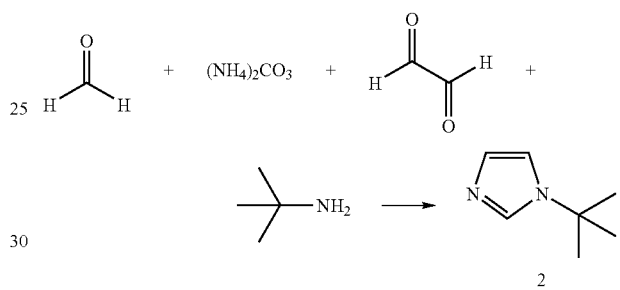

0.62 mol of paraformaldehyde (18.600 g) is initially charged in 80 ml of methanol. 0.6 mol of $^{tert}$butylamine (43.884 g, 63.32 ml) in 80 ml of methanol is cautiously added dropwise thereto with ice cooling. At a temperature of 0° C., 0.3 mol of ammonium carbonate (28.820 g) and 0.6 mol of 40% glyoxal solution (87.040 g, 68.8 mol) in 160 ml of methanol are added. Thereafter, the reaction mixture is warmed to room temperature and stirred overnight, in order that the carbon dioxide formed can escape. Ultimately, the solvent is removed and the product is distilled through a column under high vacuum.

Empirical formula: $C_7H_{12}N_2$ M=124.186 g/mol

Yield: 21.945 g (29.5% of theory)

$^1$H NMR (ppm, CDCl$_3$, 300.13 MHz):

δ=7.61 (s, 1H, NCHN); 7.04 (d, J=1.8 Hz, 1H, NCHCHN); 7.03 (d, J=1.2 Hz, 1H, NCHCHN); 1.55 (s, 9H, CH$_3$ group)

C) 1-(2,4,6-Trimethylphenyl)imidazole 3 (Liu, J. et al., A modified procedure for the synthesis of 1-arylimidazoles, *Synthesis* 2003, (17), 2661-2666)

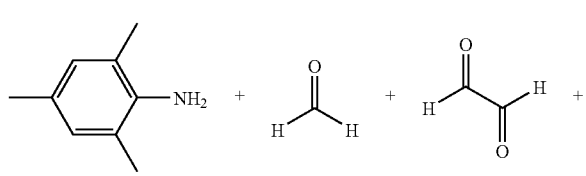

NH$_4$Cl ⟶

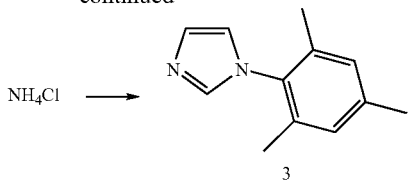

3

0.1 mol of 1,3,5-trimethylaniline (13.521 g; 14.08 ml) is dissolved in 150 ml of methanol. 0.1 mol of 40% glyoxal solution (11.4 ml) is added to this solution with stirring and the mixture is stirred at room temperature until a solid forms. Thereafter, 0.2 mol of solid ammonium chloride (10.700 g), 0.6 mol of 37% formaldehyde (16 ml) and 400 ml of methanol are added, and the mixture is boiled under reflux for one hour. 14 ml of 85% phosphoric acid are then added over ten minutes and the mixture is stirred under reflux for a further four to eight hours. Thereafter, the solvent is removed, 300 g of ice are added to the reaction mixture, and the solution is brought to a pH of 9 with 40% potassium hydroxide solution and extracted repeatedly with diethyl ether. The ether phase is dried over magnesium sulfate and then the ether is removed to form the brown solid 3. Subsequently, a recrystallization from ethyl acetate is undertaken.

Empirical formula: $C_{12}H_{14}N_2$ M=186.252 g/mol
Yield: 11.746 g (63.0% of theory)
Melting pooint: 108.6° C.
$^1$H NMR (ppm, CDCl$_3$, 300.13 MHz)
δ=7.48 (s, 1H, NCHN); 7.24 (s, 1H, NCHCHN); 6.96 (s, 2H, CH of C$_6$H$_2$); 6.88 (s, 1H, NCHCHN); 2.32 (s, 3H, 4-CH$_3$ of C$_6$H$_2$); 1.97 (s, 6H, 2,6-CH$_3$ of C$_6$H$_2$)

2 Bridged Imidazoles 2.1 Synthesis of 1,1'-methylenediimidazole 4 (Diez-Barra, E. et al., Phase transfer catalysis without solvent. Synthesis of bisazolylalkanes. *Heterocycles* 1992, 34, (7), 1365-1373)

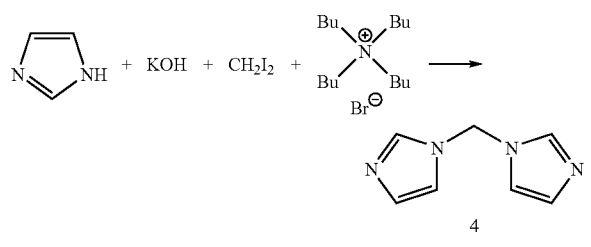

4

A mixture of 30 mmol of imidazole (2.040 g), 60 mmol of finely powdered potassium hydroxide (3.360 g) and a spatula-tip of tert-butylammonium bromide is heated cautiously and stirred efficiently until it becomes liquid. After cooling, 15 mmol of diiodomethane (4.000 g; 1.21 ml) are added. Subsequently, the mixture is heated to 50° C. for 90 minutes and to 70° C. for a further 90 minutes. The resulting mixture is extracted twice with 10 ml of ethanol, the solvent is removed and the residue is sublimed.

Empirical formula: $C_7H_8N_4$ M=148.174 g/mol
Yield: 1.053 g (47.3% of theory)
Melting point: 154.8° C.
$^1$H NMR (ppm, CDCl$_3$, 300.13 MHz):
7.93 (s, 2H, NCHN); 7.39 (s, 2H, NCHCHN); 6.90 (s, 2H, NCHCHN); 6.21 (s, 2H, NCH$_2$N)

3 Bisimidazolium Salts

Method:
The different bisimidazolium salts were prepared by slightly modified syntheses of the literature cited (Albrecht, M. et al.; Chelated Iridium(III) Bis-carbene Complexes as Air-Stable Catalysts for Transfer Hydrogenation. *Organometallics* 2002, 21, (17), 3596-3604; Maletz, G. et al.; Palladium or platinum carbene complexes as catalyst for partial oxidation of alkanes. 2001-10151660, 10151660, 20011019, 2003; Muehlhofer, M. et al; Synthesis and structural characterization of novel bridged platinum(II) biscarbene complexes. *Journal of Organometallic Chemistry* 2002, 660, (2), 121-126).

3.1 1,1'-Dimethyl-3,3'-methylenediimidazolium salts

A) Synthesis of 1,1'-dimethyl-3,3'-methylenediimidazolium dichloride 5

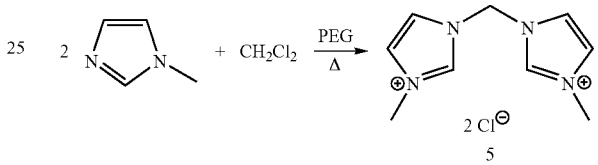

5

0.073 mol of methylimidazole (6.000 g; 5.83 ml), 0.073 mol of dichloromethane (6.200 g; 4.70 ml) and 10 ml of polyethylene glycol 400 (PEG 400) are heated to 140° C. under reflux for 12 hours. After cooling, the solid formed is filtered off and washed repeatedly with a little tetrahydrofuran. A white solid 5 is obtained.

Empirical formula: $C_9H_{14}N_4Cl_2$ M=249.142 g/mol
Yield: 2.641 g (29.0% of theory)
Melting point: decomposition at >276° C.
$^1$H (ppm, d$_6$-DMSO, 300.13 MHz):
9.88 (s, 2H, NCHN); 8.28 (s, 2H, NCHCHN); 7.82 (s, 2H, NCHCHN); 6.91 (s, 2H, NCH$_2$N); 3.90 (s, 6H, CH$_3$)

B) 1,1'-Dimethyl-3,3'-methylenedimidazolium dibromide 6

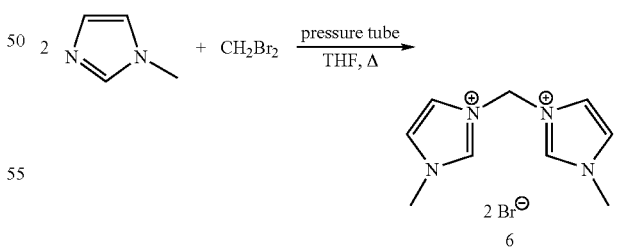

6

0.024 mol of methylimidazole (2.000 g; 1.94 ml) are admixed in an ACE pressure tube with 0.012 mol of dibromomethane (2.086 g; 0.84 ml) and 5 ml of tetrahydrofuran. The mixture is stirred at 130° C. for 24 hours, and the solid which precipitates is filtered off and washed repeatedly with a little tetrahydrofuran. The white solid 6 is obtained.

Empirical formula: $C_9H_{14}N_4Br_2$ M=338.042 g/mol
Yield: 4.051 g (99.0% of theory)

Melting point: decomposition at >278° C.
$^1$H (ppm, $d_6$-DMSO, 300.13 MHz):
δ=3.90 (s, 6H, C$\underline{H}_3$); 6.71 (s, 2H, NC$\underline{H}_2$N); 7.81 (s, 2H, NCH C$\underline{H}$N): 8.03 (s, 2H, NCHC$\underline{H}$N); 9.49 (s, 2H, NC$\underline{H}$N)

C) 1,1'-Dimethyl-3,3'-methylenediimidazolium diiodide 7

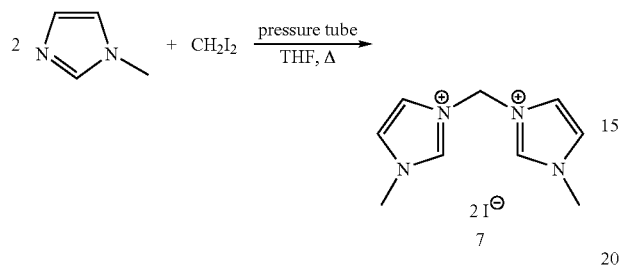

0.024 mol of methylimidazole (2.000 g; 1.94 ml) are admixed in an ACE pressure tube with 0.012 mol of diiodomethane (3.214 g; 0.97 ml) and 5 ml of tetrahydrofuran. The mixture is stirred at 110° C. for 20 hours, and the solid which precipitates is filtered off and washed repeatedly with a little tetrahydrofuran. The white solid 7 is obtained.

Empirical formula: $C_9H_{14}N_4Br_2$ M=432.042 g/mol
Yield: 5.198 g (99.9% of theory)
Melting point: decomposition at >277° C.
$^1$H (ppm, $d_6$-DMSO, 300.13 MHz):
δ=9.35 (s, 2H, NC$\underline{H}$N); 7.96 (t, 2H, J=1.7 Hz, NCHC$\underline{H}$N); 7.80 (t, 2H, J=1.7 Hz, $\underline{N}$CHCHN); 6.64 (s, 2H, NC$\underline{H}_2$N); 3.90 (s, 6H, C$\underline{H}_3$ group)

3.2 Preparation of further aliphatic bisimidazolium salts

A) 1,1'-Diisopropyl-3,3'-methylenediimidazolium dibromide 8

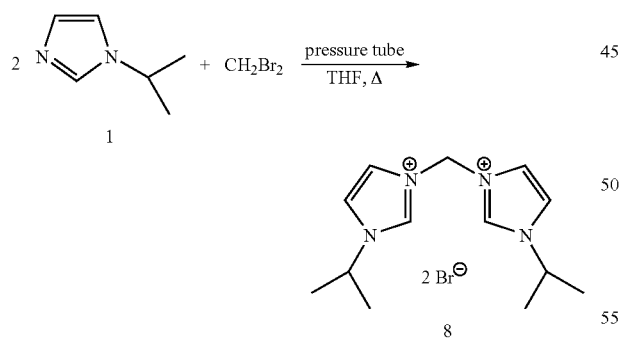

0.009 mol of dibromomethane (1.564 g; 0.63 ml) and 5 ml of tetrahydrofuran are added to 0.018 mol of $^{iso}$propylimidazole 1 (2.000 g) in an ACE pressure tube. The reaction mixture is stirred at 80° C. for 20 hours. The solid which precipitates is washed repeatedly with a little tetrahydrofuran. A white solid 8 is obtained.

Empirical formula: $C_{13}H_{22}N_4Br_2$ M=394.154 g/mol
Yield: 1.032 g (36.7% of theory)
Melting point: decomposition at >172° C.
$^1$H (ppm, $d_6$-DMSO, 300.13 MHz):
δ=9.68 (s, 2H, NC$\underline{H}$N); 8.11 (t, 2H, J=1.75 Hz, NC$\underline{H}$CHN); 8.04 (t, 2H, J=1.75 Hz, NCHC$\underline{H}$N); 6.66 (s, 2H, NC$\underline{H}_2$N); 4.70 (sept, 2H, J=6.6 Hz (CH$_3$)$_2$C$\underline{H}$N); 1.50 (d, 12H, J=6.6 Hz, C$\underline{H}_3$ group)

B) 1,1'-Diisopropyl-3,3'-methylenediimidazolium diiodide 9

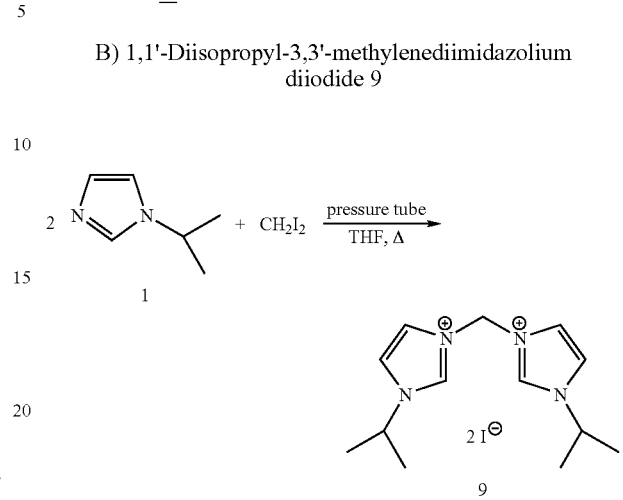

0.0135 mol of diiodomethane (3.616 g; 1.09 ml) in 7 ml of tetrahydrofuran are added to 0.027 mol of $^{iso}$propylimidazole 1 (3.000 g) in an ACE pressure tube. The mixture is stirred at 80° C. for 17 hours, and the resulting solid is filtered off and washed repeatedly with a little tetrahydrofuran. This forms a white solid 9.

Empirical formula: $C_{13}H_{22}N_4I_2$ M=488.146 g/mol
Yield: 4.832 g (73.3% of theory)
Melting point: decomposition at >247° C.
$^1$H (ppm, $d_6$-DMSO, 300.13 MHz):
δ=9.50 (s, 2H, NC$\underline{H}$N); 8.04 (s, 4H, NCHC$\underline{H}$N); 6.59 (s, 2H, NC$\underline{H}_2$N); 4.72 (sept, 2H, J=6.6 Hz, (C$\underline{H}_3$)$_2$CHN); 1.50 (d, 12H, J=6.6 Hz, C$\underline{H}_3$ group)

C) 1,1'-Dicyclohexyl-3,3'-methylenediimidazolium dibromide 10

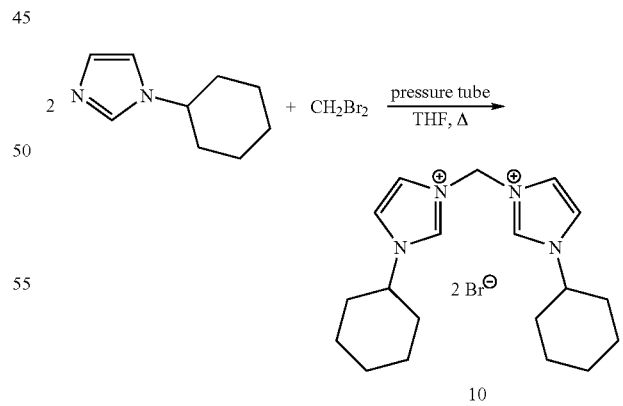

0.0065 mol of dibromomethane (1.130 g; 0.46 ml) and 5 ml of tetrahydrofuran are added to 0.013 mol of cyclohexylimidazole (2.000 g) in an ACE pressure tube. The reaction mixture is stirred at 80° C. for 20 hours. The solid which precipitates is washed repeatedly with a little tetrahydrofuran. A white solid 10 is obtained.

Empirical formula: $C_{19}H_{30}N_4Br_2$ M=474.278 g/mol

Yield: 1.003 g (32.5% of theory)

Melting point: decomposition at >288° C.

$^1H$ (ppm, $d_6$-DMSO, 300.13 MHz):

δ=9.65 (s, 2H, NC$\underline{H}$N); 8.09 (s, 2H, NC$\underline{H}$CHN); 8.02 (s, 2H, NCHC$\underline{H}$N); 6.67 (s, 2H, NC$\underline{H_2}$N); 4.35 (t, 2H, J=11.6 Hz, C$\underline{H}$ of cyclohexyl ring); 2.09 (d, 4H, J=10.5 Hz, C$\underline{H_2}$ of cyclohexyl ring); 1.84 (d, 4H, J=13.3 Hz, C$\underline{H_2}$ of cyclohexyl ring); 1.69 (d, 4H, J=12.0 Hz, C$\underline{H_2}$ of cyclohexyl ring); 1.38 (quart. 4H, J=12.7 Hz, C$\underline{H_2}$ of cyclohexyl ring); 1.22 (t, 4H, J=12.5 Hz, C$\underline{H_2}$ of cyclohexyl ring)

D) 1,1'-Dicyclohexyl-3,3'-methylenediimidazolium diiodide 11

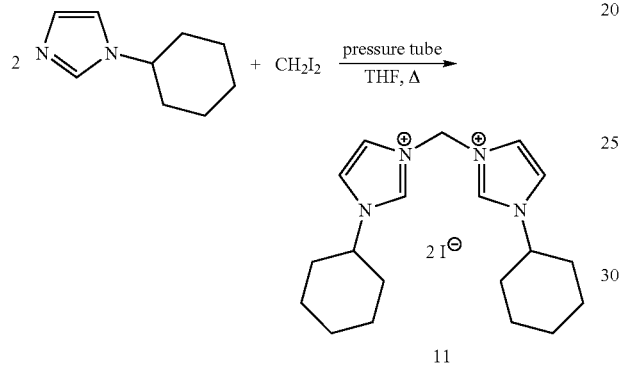

0.0065 mol of diiodomethane (1.741 g; 0.52 ml) and 5 ml of tetrahydrofuran are added to 0.013 mol of cyclohexylimidazole (2.000 g) in an ACE pressure tube. The reaction mixture is stirred at 80° C. for 3 hours. The solid which precipitates is washed repeatedly with a little tetrahydrofuran. The white solid 11 is obtained.

Empirical formula: $C_{19}H_{30}N_4I_2$ M=568.270 g/mol

Yield: 0.891 g (24.1% of theory)

Melting point: decomposition at >286° C.

$^1H$ (ppm, $d_6$-DMSO, 300.13 MHz):

δ=9.45 (s, 2H, NC$\underline{H}$N); 8.01 (dd, 4H, J=1.6 Hz, NC$\underline{H}$C$\underline{H}$N); 6.58 (s, 2H, NC$\underline{H_2}$N); 4.36 (t, 2H, J=11.7 Hz, C$\underline{H}$ of cyclohexyl ring); 2.09 (d, 4H, J=9.7 Hz, C$\underline{H_2}$ of cyclohexyl ring); 1.85 (d, 4H, J=13.3 Hz, C$\underline{H_2}$ of cyclohexyl ring); 1.68 (d, 4H, J=12.3 Hz, C$\underline{H_2}$ of cyclohexyl ring); 1.40 (quart, 4H, J=12.7 Hz, C$\underline{H_2}$ of cyclohexyl ring); 1.23 (t, 4H, J=12.5 Hz, C$\underline{H_2}$ of cyclohexyl ring)

E) 1,1'-Di-tert-butyl-3,3'-methylenedimidazolium dibromide 12

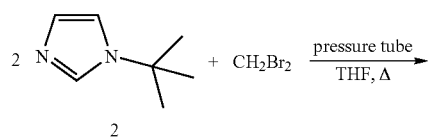

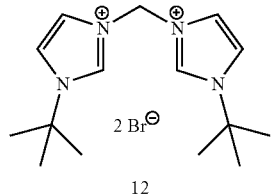

0.008 mol of dibromomethane (1.391 g; 0.56 ml) and 5 ml of tetrahydrofuran are added to 0.016 mol of $^{tert}$butylimidazole 2 (2.000 g) in an ACE pressure tube. The reaction mixture is stirred at 80° C. for 20 hours. The solid which precipitates is washed repeatedly with a little tetrahydrofuran. A white solid 12 is obtained.

Empirical formula: $C_{15}H_{26}N_4Br_2$ M=422.206 g/mol

Yield: 1.449 g (42.9% of theory)

Melting point: decomposition at >230° C.

$^1H$ (ppm, $d_6$-DMSO, 300.13 MHz):

δ=9.85 (s, 2H, NC$\underline{H}$N); 8.21 (s, 2H, NC$\underline{H}$CHN); 8.17 (s, 2H, NCHC$\underline{H}$N); 6.67 (s, 2H, NC$\underline{H_2}$N); 1.62 (s, 18H, C$\underline{H_3}$ group)

F) 1,1'-Di-tert-butyl-3,3'-methylenediimidazolium diiodide 13

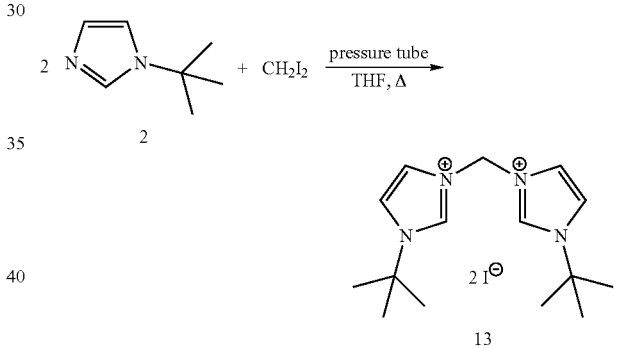

0.008 mol of diiodomethane (2.143 g; 0.64 ml) and 5 ml of tetrahydrofuran are added to 0.016 mol of $^{tert}$butylimidazole 2 (2.000 g) in an ACE pressure tube. The reaction mixture is stirred at 80° C. for 3 hours. The precipitated solid is washed repeatedly with a little tetrahydrofuran. The white solid 13 is obtained.

Empirical formula: $C_{15}H_{26}N_4I_2$ M=516.198 g/mol

Yield: 1.444 g (35.0% of theory)

Melting point: decomposition at >249° C.

$^1H$ (ppm, $d_6$-DMSO, 300.13 MHz):

δ=9.55 (s, 2H, NC$\underline{H}$N); 8.17 (s, 2H, NC$\underline{H}$CHN); 8.06 (s, 2H, NCHC$\underline{H}$N); 6.54 (s, 2H, NC$\underline{H_2}$N); 1.61 (s, 18H, C$\underline{H_3}$ group)

G) 1,1'-Di-n-butyl-3,3'-methylenediimidazolium dibromide 14

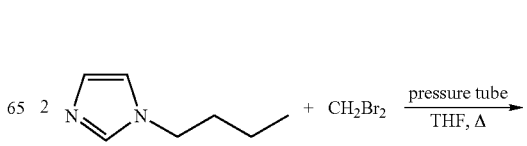

-continued

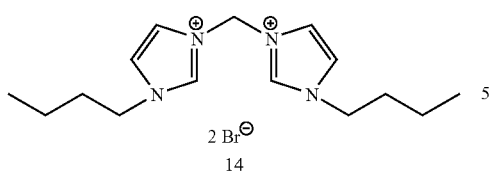

14

0.012 mol of dibromomethane (2.086 g; 0.84 ml) and 7 ml of tetrahydrofuran are added to 0.024 mol of n-butylimidazole (3.000 g; 3.17 ml) in an ACE pressure tube. The reaction mixture is stirred at room temperature for 5 days and at 80° C. for 72 hours. The solid which precipitates is washed repeatedly with a little tetrahydrofuran. The white solid 14 is obtained.

Empirical formula: $C_{15}H_{26}N_4Br_2$ M=422.206 g/mol
Yield: 4.437 g (87.6% of theory)
Melting point: 178.6° C.
$^1$H (ppm, $d_6$-DMSO, 300.13 MHz):
δ=9.68 (s, 2H, NCHN); 8.12 (t, 2H, J=1.7 Hz, NCHCHN); 7.93 (t, 2H, J=1.7 Hz, NCHCHN); 6.74 (s, 2H, NCH$_2$N); 4.24 (t, 4H, J=7.2 Hz, N—CH$_2$—CH$_2$—CH$_2$—CH$_3$); 1.80 (quint, 4H, J=7.3 Hz, N—CH$_2$—CH$_2$—CH$_2$—CH$_3$); 1.30 (sext, 4H, J=7.4 Hz, N—CH$_2$—CH$_2$—CH$_2$—CH$_3$); 0.91 (t, 6H, J=7.3 Hz, N—CH$_2$—CH$_2$—CH$_3$)

H) 1,1'-Di-n-butyl-3,3'-methylenediimidazolium diiodide 15

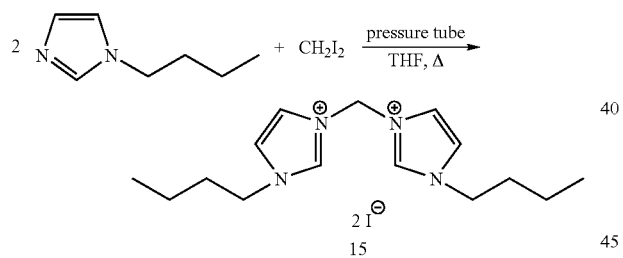

15

0.012 mol of diiodomethane (3.214 g; 0.97 ml) and 7 ml of tetrahydrofuran are added to 0.024 mol of n-butylimidazole (3.000 g; 3.17 ml) in an ACE pressure tube. The reaction mixture is stirred at room temperature for 5 days and at 80° C. for 72 hours. The solid which precipitates is washed repeatedly with a little tetrahydrofuran. The light red solid 15 is obtained.

Empirical formula: $C_{15}H_{26}N_4I_2$ M=516.198 g/mol
Yield: 5.929 g (95.7% of theory)
Melting point: 151.4° C.
$^1$H (ppm, $d_6$-DMSO, 300.13 MHz):
δ=9.44 (s, 2H, NCHN); 8.00 (s, 2H, NCHCHN); 7.92 (s, 2H, NCHCHN); 6.63 (s, 2H, NCH$_2$N); 4.23 (t, 4H, J=7.2 Hz, N—CH$_2$—CH$_2$—CH$_2$—CH$_3$); 1.79 (quint, 4H, J=7.3 Hz, N—CH$_2$—CH$_2$—CH$_2$—CH$_3$); 1.31 (sext, 4H, J=7.4 Hz, N—CH$_2$—CH$_2$—CH$_2$—CH$_3$); 0.91 (t, 6H, J=7.3 Hz, N—CH$_2$—CH$_2$—CH$_2$—CH$_3$)

3.3 Preparation of Aromatic Bisimidazolium Salts

A) 1,1'-Di-(2,4,6-trimethylphenyl)-3,3'-methylenediimidazolium dibromide 16

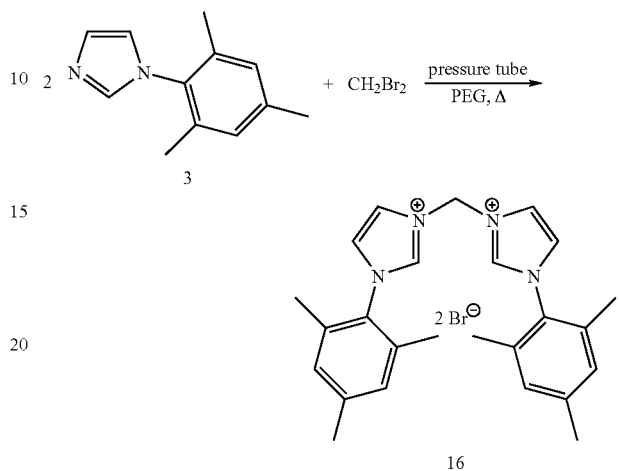

16

0.011 mol of 1-(2,4,6-trimethylphenyl)imidazole 3 (2.000 g), 0.0054 mol of dibromomethane (0.939 g; 0.38 ml) and 5 ml of PEG 400 are stirred in a pressure tube at 120° C. overnight. The precipitated solid is filtered off and washed repeatedly with a little tetrahydrofuran.

Empirical formula: $C_{25}H_{30}N_4Br_2$ M=546.33 g/mol
Yield: 1.581 g (53.6% of theory)
Melting point: decomposition at >285° C.
$^1$H (ppm, $d_6$-DMSO, 300.13 MHz):
δ=9.95 (s, 2H, NCHN); 8.43 (s, 2H, NCHCHN); 8.10 (s, 2H, NCHCHN); 7.18 (s, 4H, CH of $C_6H_2$); 6.91 (s, 2H, NCH$_2$N); 2.34 (s, 6H, p-CH$_3$ of $C_6H_2$); 2.05 (s, 12H, o-CH$_3$ of $C_6H_2$)

B) 1,1'-Di-(2,4,6-trimethylphenyl)-3,3'-methylenediimidazolium diiodide 17

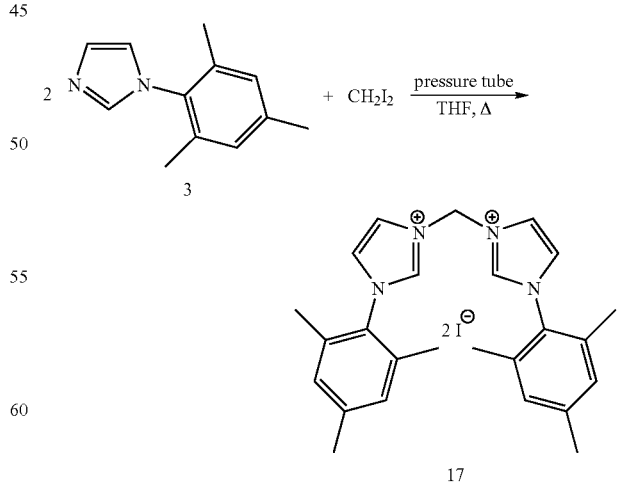

17

0.011 mol of 1-(2,4,6-trimethylphenyl)imidazole 3 (2.000 g), 0.0054 mol of diiodomethane (1.438 g; 0.43 ml) and 5 ml of THF are stirred in a pressure tube at room temperature overnight and then at 120° C. for 9 hours. The precipitated solid is filtered off and washed repeatedly with a little tetrahydrofuran.

Empirical formula: $C_{25}H_{30}N_4I_2$ M=640.33 g/mol
Yield: 1.053 g (30.5% of theory)
Melting point: decomposition at >310° C.
$^1$H (ppm, $d_6$-DMSO, 300.13 MHz):
δ=9.79 (s, 2H, NCHN); 8.35 (s, 2H, J=1.7 Hz, NCHCHN); 8.11 (s, 2H, J=1.6 Hz, NCHCHN); 7.18 (s, 4H, CH of $C_6\overline{H}_2$); 6.86 (s, 2H, NC$\underline{H}_2$N); 2.3$\overline{4}$ (s, 6H, p-C$\underline{H}_3$ of $C_6\overline{H}_2$); 2.05 (s, 12H, o-C$\underline{H}_3$ of $\overline{C_6H_2}$)

C) 1,1'-Di-(4-methylphenyl)-3,3'-methylenediimidazolium dibromide 18

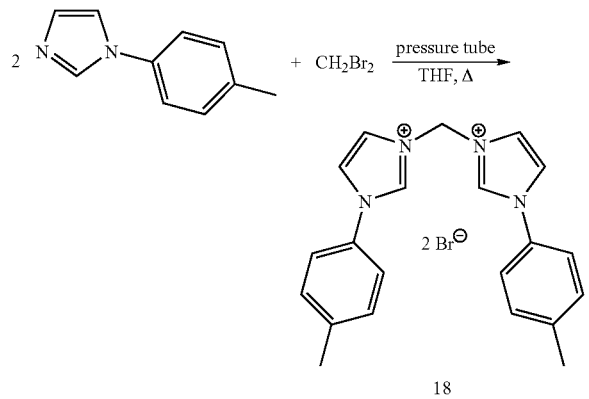

0.013 mol of 1-(4-methylphenyl)imidazole (2.000 g), 0.0063 mol of dibromomethane (1.099 g; 0.45 ml) and 5 ml of THF are stirred in a pressure tube at room temperature overnight and then at 120° C. for 9 hours. The precipitated solid is filtered off and washed repeatedly with a little tetrahydrofuran.

Empirical formula: $C_{21}H_{22}N_4Br_2$ M=490.234 g/mol
Yield: 0.779 g (25.2% of theory)
Melting point: decomposition at >300° C.
$^1$H (ppm, $d_6$-DMSO, 300.13 MHz):
δ=10.30 (s, 2H, NCHN); 8.42 (s, 2H, NCHCHN); 8.38 (s, 2H, NCHCHN); 7.71 (d, 4H, J=8.4 Hz, arom. $\overline{C}$H); 7.51 (d, 4H, J=8.$\overline{4}$ Hz, arom. CH); 6.89 (s, 2H, NC$\underline{H}_2$N); $\overline{2}$.41 (s, 6H, p-C$\underline{H}_3$ of $C_6H_2$)

3.4 Preparation of 1,1'-dibenzyl-3,3'-methylenediimidazolium dibromide 19

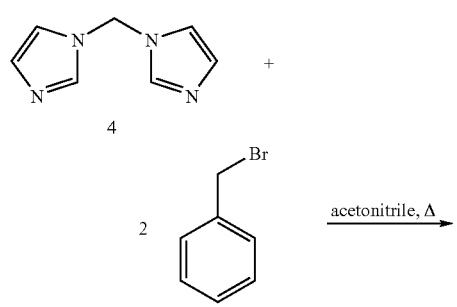

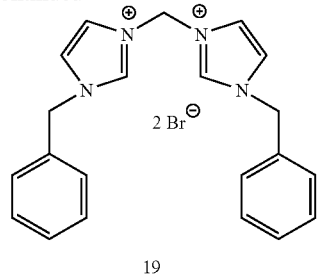

2 ml of benzyl bromide in 8 ml of tetrahydrofuran are added to 0.0034 mol of 1,1'-methylenediimidazole 4 in an ACE pressure tube, and the mixture is stirred at room temperature for 4 days. The precipitated solid is washed with tetrahydrofuran and then taken up in acetonitrile, admixed once again with 1 ml of benzyl bromide and stirred at 60° C. for 24 hours, at room temperature for 3 days and at 80° C. for a further 30 hours. The resulting solid is filtered off, washed again with tetrahydrofuran and dried. This forms a white solid 19.

Empirical formula: $C_{21}H_{22}N_4Br_2$ M=490.234 g/mol
Yield: 0.771 g (46.3% of theory)
Melting point: decomposition at >248° C.
$^1$H (ppm, $d_6$-DMSO, 300.13 MHz):
δ=9.68 (s, 2H, NCHN); 8.11 (s, 2H, NCHCHN); 7.93 (s, 2H, NCHCHN); 7.44 (m, 10H, J=5.0 Hz, aro$\overline{m}$. CH); 6.71 (s, 2H, NC$\underline{H}_2$$\overline{N}$); 5.52 (s, 4H, N—C$\underline{H}_2$—$C_6H_5$)

4 Carbene Complexes 4.1 Biscarbene complexes

A) (1,1'-Dimethyl-3,3'-methylenediimidazoline-2,2'-diylidene)platinum(II) dibromide 20

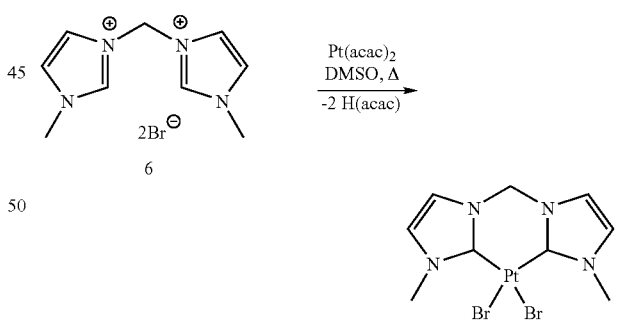

0.5 mmol of platinum(II) acetylacetonate (0.197 g) is initially charged in 3 ml of dimethyl sulfoxide and heated to 100° C. A solution of 0.5 mmol of 1,1'-dimethyl-3,3'-methylenediimidazolium dibromide 6 (0.169 g) in 20 ml of dimethyl sulfoxide is added thereto with the aid of a syringe pump over 13 hours. The entire reaction mixture is stirred at 10° C. for a further 2 hours. Thereafter, the solvent is removed under reduced pressure at 70° C. and the resulting solid is washed twice with a little water and twice with a little tetrahydrofuran. The white solid 20 is then dried.

Empirical formula: $C_9H_{12}N_4PtBr_2$ M=531.112 g/mol
Yield: 0.179 g (67.4% of theory)
Melting point: decomposition at >380° C.
$^1H$ (ppm, $d_6$-DMSO, 300.13 MHz):
δ=7.53 (s, 2H, J=2.0 HZ, NCHCHN); 7.31 (s, 2H, J=2.0 Hz, NCHCHN); 6.10 (AB, 1H, $\overline{J}$=13.1 Hz, NC$\underline{H}_2$N); 5.96 (AB, 1H, J=13.1 Hz, NC$\underline{H}_2$N); 3.84 (s, 6H, C$\underline{H}_3$ group)

B) (1,1'-Dimethyl-3,3'-methylenediimidazoline-2,2'-diylidene)platinum(II) diacetate 21

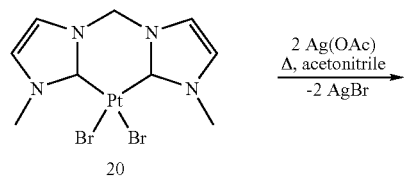

0.38 mmol of silver acetate (0.063 g) in 5 ml of acetonitrile are added to 0.19 mmol of (1,1'-dimethyl-3,3'-methylenediimidazoline-2,2'-ylidene)platinum(II) dibromide 20 (0.100 g). The mixture is stirred at 60° C. with exclusion of light for 8 hours. The silver bromide which precipitates and the unconverted reactant are filtered off and the solvent is removed under reduced pressure. This forms a white solid 21.
Empirical formula: $C_{13}H_{18}N_4O_4Pt$ M=489.392 g/mol
Yield: 0.057 g (61.3% of theory)
Melting point: decomposition at >310° C.
$^1H$ (ppm, $d_6$-DMSO, 300.13 MHz):
δ=7.60 (d, 2H, J=1.9 Hz, NCHCHN); 7.37 (s, 2H, J=1.9 Hz, NCHCHN); 6.12 (s, 2H, NC$\underline{H}_2$N); 3.78 (s, 6H, C$\underline{H}_3$ group); 1.89 (s, 6H, C$\underline{H}_3$COO)

C) (1,1'-Diisopropyl-3,3'-methylenediimidazoline-2,2'-diylidene)platinum(II) dibromide 22

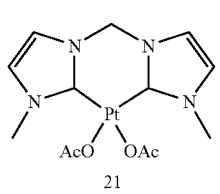

0.75 mmol of platinum(II) acetylacetonate (0.295 g) are combined with 0.75 mmol of 1,1'-diisopropyl-3,3'-methylenediimidazolium dibromide 8 (0.296 g) in a Schlenk tube. 6 ml of dimethyl sulfoxide are added and the reaction mixture is stirred at 60° C. for 2 hours, and then at 80° C. for 2 hours and at 110° C. for a further 5 hours. The solvent is removed under reduced pressure at 70° C., and the solid which precipitates is washed with a little methanol and tetrahydrofuran and then dried. This forms a white solid 22.
Empirical formula: $C_{13}H_{20}N_4PtBr_2$ M=587.216 g/mol
Yield: 0.368 g (83.6% of theory)
Melting point: decomposition at >270° C.
$^1H$ (ppm, $d_6$-DMSO, 300.13 MHz):
δ=7.55 (d, 2H, J=2.1 Hz, NCHCHN); 7.51 (s, 2H, J=2.1 Hz, NCHCHN); 6.05 (AB, 1H, $\overline{J}$=13.1 Hz, NC$\underline{H}_2$N); 5.96 (AB, 1H, J=13.1 Hz, NC$\underline{H}_2$N); 5.53 (sept, 2H, $\overline{J}$=6.7 Hz, (CH$_3$)$_2$C$\underline{H}$N); 1.44 (d, 6H, $\overline{J}$=6.7 Hz, C$\underline{H}_3$ group); 1.19 (d, 6H, J=6.7 Hz, C$\underline{H}_3$ group)

D) (1,1'-Diisopropyl-3,3'-methylenediimidazoline-2,2'-ylidene)platinum(II) diiodide 23

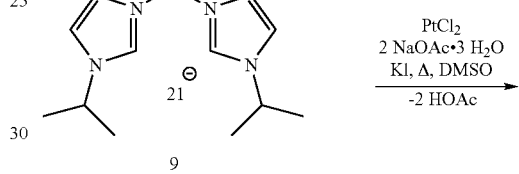

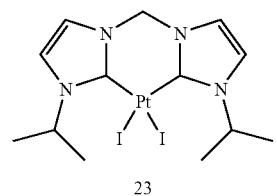

0.25 mmol of platinum(II) chloride (0.066 g) and 0.25 mmol of 1,1'-diisopropyl-3,3'-methylenediimidazolium diiodide 9 (0.122 g), and also 0.5 mmol of sodium acetate trihydrate (0.068 g) and 0.05 mmol of potassium iodide (0.083 g), are stirred with 5 ml of dimethyl sulfoxide in a Schlenk tube at 60° C. for 3 hours, at 80° C. for 3 hours and at 110° C. for a further 3 hours. The solvent is then removed at 70° C. under reduced pressure and the resulting solid is washed with methanol and tetrahydrofuran and dried. This forms a white solid 23.
Empirical formula: $C_{13}H_{20}N_4PtI_2$ M=681.207 g/mol
Yield: 0.116 g (68.1% of theory)
Melting point: decomposition at >340° C.
$^1H$ (ppm, $d_6$-DMSO, 300.13 MHz):
δ=7.56 (d, 2H, J=2.1 Hz, NCHCHN); 7.51 (d, 2H, J=2.2 Hz, NCHC$\underline{H}$N); 6.07 (AB, 1H, $\overline{J}$=13.1 Hz, NC$\underline{H}_2$N); 5.98

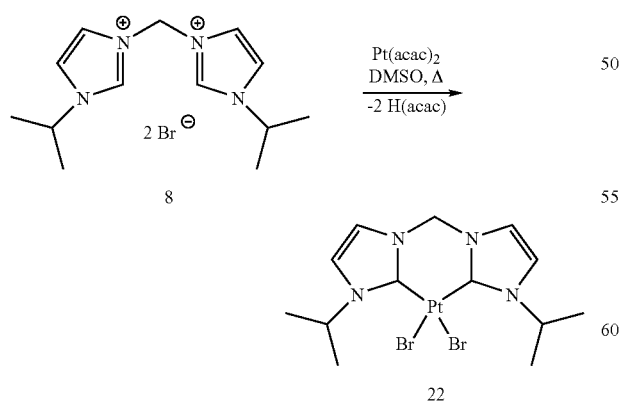

(AB, 1H, J=13.1 Hz, NCH$_2$N); 5.47 (sept, 2H, J=6.8 Hz, (CH$_3$)$_2$CHN); 1.46 (d, 6H, J=6.7 Hz, CH$_3$ group); 1.17 (d, 6H, J=6.8 Hz, CH$_3$ group)

E) (1,1'-Diisopropyl-3,3'-methylenediimidazoline-2,2'-diylidene)platinum(II) diacetate 24

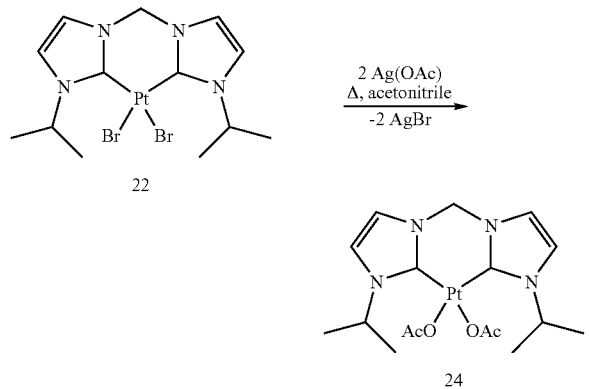

0.86 mmol of silver acetate (0.143 g) in 6 ml of acetonitrile are added to 0.43 mmol of (1,1'-diisopropyl-3,3'-methylenediimidazoline-2,2'-diylidene)-platinum(II) dibromide 22 (0.250 g). The mixture is stirred at 60° C. with exclusion of light for 8 hours. The silver bromide which precipitates is filtered off and the solvent is removed under reduced pressure. This forms a white solid 24.

Empirical formula: C$_{17}$H$_{26}$N$_4$O$_4$Pt M=545.496 g/mol
Yield: 0.225 g (95.9% of theory)
Melting point: decomposition at >130° C.
$^1$H (ppm, d$_6$-DMSO, 300.13 MHz):
δ=7.52 (d, 2H, J=1.8 Hz, NCHCHN); 7.47 (d, 2H, J=2.0 Hz, 2H, NCHCHN); 6.08 (AB, 1H, J=12.8 Hz, NCH$_2$N); 5.90 (AB, 1H, J=12.8 Hz, NCH$_2$N); 5.10 (sept, 2H, J=6.6 Hz, (CH$_3$)$_2$CHN); 1.75 (s, 6H, CH$_3$COO); 1.34 (d, 6H, J=6.5 Hz, CH$_3$ group); 1.25 (d, 6H, J=6.6 Hz, CH$_3$ group)

F) (1,1'-Dicyclohexyl-3,3'-methylenediimidazoline-2,2'-diylidene)platinum(II) dibromide 25

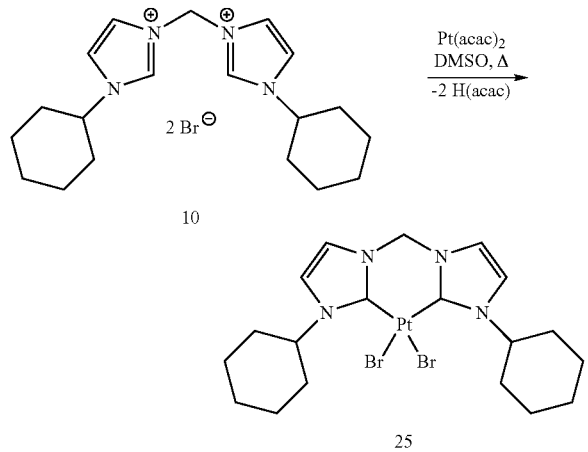

0.75 mmol of platinum(II) acetylacetonate (0.295 g) is combined with 0.75 mmol of 1,1'-dicyclohexyl-3,3'-methylenediimidazolium dibromide 10 (0.356 g) in a Schlenk tube. 6 ml of dimethyl sulfoxide are added and the reaction mixture is stirred at 60° C. for 2 hours, then at 80° C. for 2 hours and at 110° C. for a further 5 hours. The solvent is removed at 70° C. under reduced pressure, and the solid which precipitates is washed with a little methanol and tetrahydrofuran and then dried. This forms a white solid 25.

Empirical formula: C$_{19}$H$_{28}$N$_4$PtBr$_2$ M=667.34 g/mol
Yield: 0.294 g (58.7% of theory)
Melting point: decomposition at >340° C.
$^1$H (ppm, d$_6$-DMSO, 300.13 MHz):
δ=7.53 (s, 2H, NCHCHN); 7.51 (s, 2H, NCHCHN); 6.05 (AB, 1H, J=13.1 Hz, NCH$_2$N); 5.96 (AB, 1H, J=13.0 Hz, NCH$_2$N); 5.13 (t, 2H, J=11.6 Hz, CH$_2$ of cyclohexyl ring); 2.12 (d, 4H, J=10.5 Hz, CH$_2$ of cyclohexyl ring; 1.80 (d, 4H, J=13.1 Hz, CH$_2$ of cyclohexyl ring); 1.50 (d, 4H, J=11.9 Hz, CH$_2$ of cyclohexyl ring); 1.34 (t, 4H, J=12.2 Hz, CH$_2$ of cyclohexyl ring); 1.21 (t, 4H, J=13.1 Hz, CH$_2$ of cyclohexyl ring)

G) (1,1'-Dicyclohexyl-3,3'-methylenediimidazoline-2,2'-diylidene)platinum(II) diiodide 26

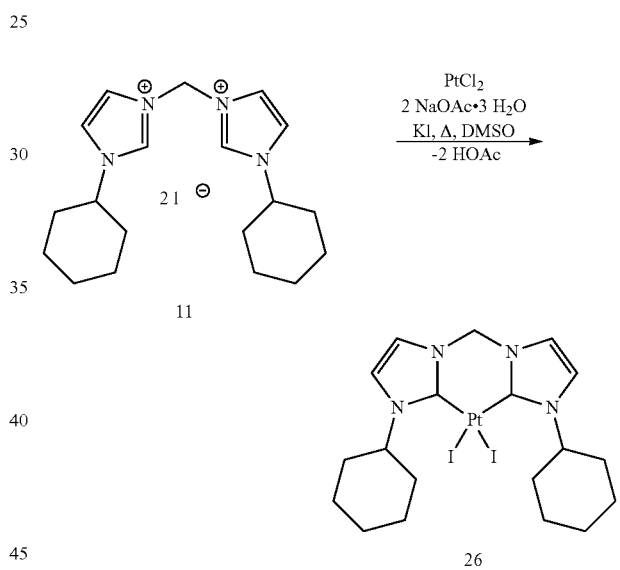

0.4 mmol of platinum(II) chloride (0.106 g) and 0.4 mmol of 1,1'-dicyclohexyl-3,3'-methylenediimidazolium diiodide 11 (0.227 g), and also 0.8 mmol of sodium acetate trihydrate (0.109 g) and 0.8 mmol of potassium iodide (0.133 g) are stirred with 5 ml of dimethyl sulfoxide in a Schlenk tube at 60° C. for 2 hours, at 80° C. for 2 hours and at 110° C. for a further 5 hours. The solvent is then removed under reduced pressure at 70° C. and the resulting solid is washed with methanol and tetrahydrofuran and dried. This forms a white solid 26.

Empirical formula: C$_{19}$H$_{28}$N$_4$PtI$_2$ M=761.332 g/mol
Yield: 0.221 g (72.6% of theory)
Melting point: decomposition at >382° C.
$^1$H (ppm, d$_6$-DMSO, 300.13 MHz):
δ=7.59 (s, 2H, NCHCHN); 7.57 (s, 2H, NCHCHN); 6.11 (AB, 1H, J=13.2 Hz, NCH$_2$N); 5.99 (AB, 1H, J=13.2 Hz, NCH$_2$N); 5.21 (t, 2H, J=11.6 Hz, CH of cyclohexyl ring); 2.13 (d, 4H, J=10.9 Hz, CH$_2$ of cyclohexyl ring; 1.84 (d, 4H, J=13.0 Hz, CH$_2$ of cyclohexyl ring); 1.59 (d, 4H, J=11.9 Hz, CH$_2$ of cyclohexyl ring); 1.39 (t, 4H, J=11.8 Hz, CH$_2$ of cyclohexyl ring); 1.28 (t, 4H, J=12.6 Hz, CH$_2$ of cyclohexyl ring)

H) (1,1'-Dicyclohexyl-3,3'-methylenediimidazoline-2,2'-diylidene)platinum(I) diacetate 27

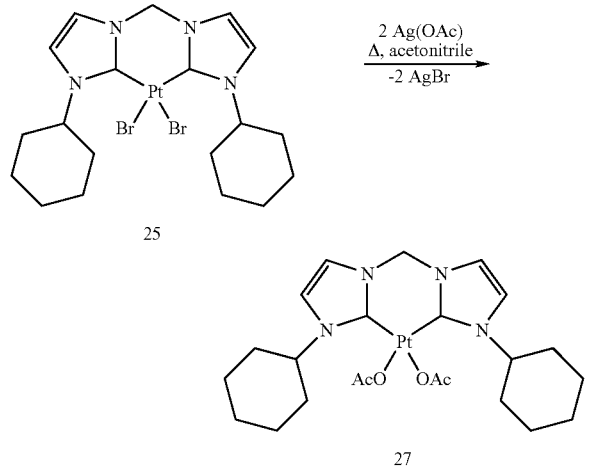

0.60 mmol of silver acetate (0.100 g) in 7 ml of acetonitrile are added to 0.30 mmol of (1,1'-dicyclohexyl-3,3'-methylenediimidazoline-2,2'-diylidene)-platinum(II) dibromide 25 (0.200 g). The mixture is stirred at 60° C. with exclusion of light for 8 hours. The silver bromide which precipitates is filtered off and the solvent is removed under reduced pressure. This forms a white solid 27.

Empirical formula: C$_{23}$H$_{34}$N$_4$O$_4$Pt M=625.62 g/mol
Yield: 0.186 g (99.1% of theory)
Melting point: decomposition at >320° C.
$^1$H (ppm, d$_6$-DMSO, 300.13 MHz):
δ=7.51 (s, 2H, NCHCHN); 7.48 (s, 2H, NCHCHN); 6.07 (AB, 1H, J=12.9 Hz, NCH$_2$N); 5.91 (AB, 1H, J=12.8 Hz, NCH$_2$N); 4.73 (t, 2H, J=11.7 Hz, CH of cyclohexyl ring); 1.75 (s, 6H, CH$_3$COO); 1.67 (d, 4H, J=11.8 Hz, CH$_2$ of cyclohexyl ring); 1.62 (d, 4H, J=11.2 Hz, CH$_2$ of cyclohexyl ring); 1.56 (d, 4H, J=11.0 Hz, CH$_2$ of cyclohexyl ring); 1.38 (t, 4H, J=12.3 Hz, CH$_2$ of cyclohexyl ring); 1.20 (t, 4H, J=11.9 Hz, CH$_2$ of cyclohexyl ring)

I) (1,1'-Di-n-butyl-3,3'-methylenediimidazoline-2,2'-diylidene)platinum(II) dibromide 28

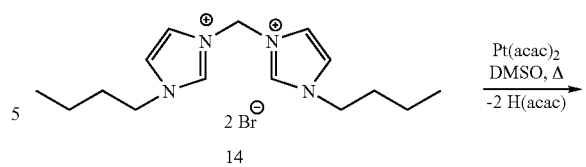

0.75 mmol of platinum(II) acetylacetonate (0.295 g) are combined with 0.75 mmol of 1,1'-di-n-butyl-3,3'-methylenediimidazolium dibromide 14 (0.317 g) in a Schlenk tube. 6 ml of dimethyl sulfoxide are added and the reaction mixture is stirred at 60° C. for 2 hours, then at 80° C. for 2 hours and at 110° C. for a further 5 hours. The solvent is removed under reduced pressure at 70° C., and the solid which precipitates is washed with a little methanol and tetrahydrofuran and then dried. This forms a white solid 28

Empirical formula: C$_{15}$H$_{24}$N$_4$PtBr$_2$ M=615.268 g/mol
Yield: 0.316 g (68.5% of theory)
Melting point: 2210° C.
$^1$H (ppm, d$_6$-DMSO, 300.13 MHz):
δ=7.52 (d, 2H, J=1.9 Hz, NCHCHN); 7.38 (d, 2H, J=1.9 Hz, NCHCHN); 6.08 (AB, 1H, J=13.1 Hz, NCH$_2$N); 5.97 (AB, 1H, J=13.1 Hz, NCH$_2$N); 4.80 (m, 2H, J=7.3 Hz, N—CH$_2$—CH$_2$—CH$_2$—CH$_3$); 3.97 (m, 2H, J=7.1 Hz, N—CH$_2$—CH$_2$—CH$_2$—CH$_3$); 1.73 (quint, 4H, J=7.1 Hz, N—CH$_2$—CH$_2$—CH$_2$—CH$_3$); 1.17 (sext, 4H, J=7.2 Hz, N—CH$_2$—CH$_2$—CH$_2$—CH$_3$); 0.86 (t, 6H, J=7.3 Hz, N—CH$_2$—CH$_2$—CH$_2$—CH$_3$)

J) (1,1'-Di-n-butyl-3,3'-methylenediimidazoline-2,2'-diylidene)platinum(1) diiodide 29

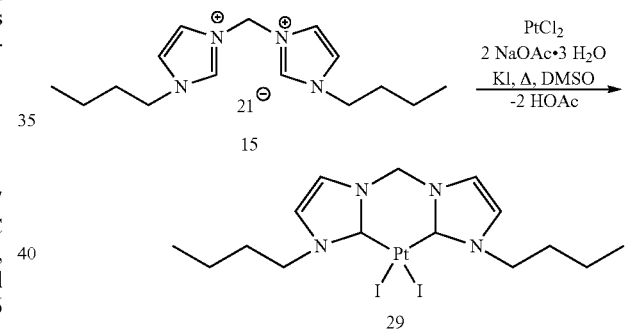

0.5 mmol of platinum(II) chloride (0.133 g) and 0.5 mmol of 1,1'-di-n-butyl-3,3'-methylenediimidazolium diiodide 15 (0.258 g), and also 1 mmol of sodium acetate trihydrate (0.136 g) and 1 mmol of potassium iodide (0.166 g), are stirred with 5 ml of dimethyl sulfoxide in a Schlenk tube at 60° C. for 2 hours, at 80° C. for 2 hours and at 110° C. for a further 5 hours. The solvent is then removed under reduced pressure at 70° C. and the solid formed is washed with methanol and tetrahydrofuran and dried. This forms a white solid 29.

Empirical formula: C$_{15}$H$_{24}$N$_4$PtI$_2$ M=709.260 g/mol
Yield: 0.232 g (65.4% of theory)
Melting point: 249.8° C.
$^1$H (ppm, d$_6$-DMSO, 300.13 MHz):
δ=7.51 (d, 2H, J=1.8 Hz, NCHCHN); 7.37 (d, 2H, J=1.9 Hz, NCHCHN); 6.10 (AB, 1H, J=13.0 Hz, NCH$_2$N); 5.94 (AB, 1H, J=13.0 Hz, NCH$_2$N); 4.83 (m, 2H, J=7.5 Hz, N—CH$_2$—CH$_2$—CH$_2$—CH$_3$); 3.96 (m, 2H, J=6.6 Hz, N—CH$_2$—CH$_2$—CH$_2$—CH$_3$); 1.74 (quint, 4H, J=7.2 Hz, N—CH$_2$—CH$_2$—CH$_2$—CH$_3$); 1.18 (sext, 4H, J=7.2 Hz, N—CH$_2$—CH$_2$—CH$_2$—CH$_3$); 0.86 (t, 6H, J=7.4 Hz, N—CH$_2$—CH$_2$—CH$_2$—CH$_3$)

K) (1,1'-Di-n-butyl-3,3'-methylenediimidazoline-2,2'-diylidene)platinum(II) diacetate 30

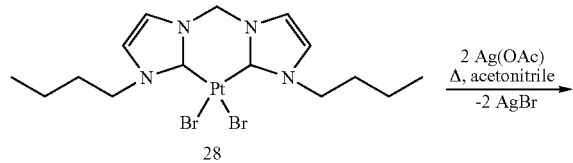

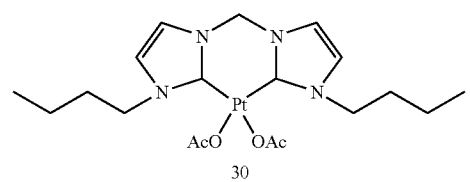

0.32 mmol of silver acetate (0.054 g) in 5 ml of acetonitrile are added to 0.16 mmol of (1,1'-di-n-butyl-3,3'-methylenediimidazoline-2,2'-diylidene)-platinum(II) dibromide 28 (0.100 g). The mixture is stirred at 60° C. with exclusion of light for 8 hours. The silver bromide which precipitates is filtered off and the solvent is removed under reduced pressure. This forms a white solid 30.

Empirical formula: C$_{19}$H$_{30}$N$_4$O$_4$Pt M=573.548 g/mol

Yield: 0.093 g (99.9% of theory)

$^1$H (ppm, d$_6$-DMSO, 300.13 MHz):

δ=7.32 (s, 2H, NCHCHN); 7.14 (s, 2H, NCHCHN); 5.92 (AB, 1H, J=13.2 Hz, NCH$_2$N); 5.67 (AB, 1H, J=13.2 Hz, NCH$_2$N); 4.07 (m, 2H, J=7.1 Hz, N—CH$_2$—CH$_2$—CH$_2$—CH$_3$); 3.77 (m, 2H, J=7.0 Hz, N—CH$_2$—CH$_2$—CH$_2$—CH$_3$); 1.58 (s, 6H, CH$_3$COO); 1.52 (quint, 4H, J=5.6 Hz, N—CH$_2$—CH$_2$—CH$_2$—CH$_3$); 1.03 (sext, 4H, J=6.8 Hz, N—CH$_2$—CH$_2$—CH$_2$—CH$_3$); 0.68 (t, 6H, J=7.3 Hz, N—CH$_2$—CH$_2$—CH$_2$—CH$_3$)

L) (1,1'-Dibenzyl-3,3'-methylenediimidazoline-2,2'-diylidene)platinum(I) dibromide 31

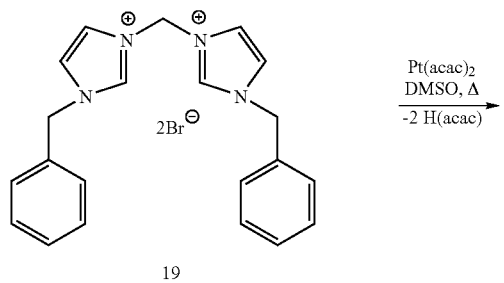

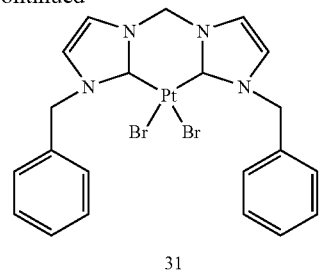

0.408 mmol of platinum(II) acetylacetonate (0.160 g) are combined with 0.408 mmol of 1,1'-dibenzyl-3,3'-methylenediimidazolium dibromide 19 (0.200 g) in a Schlenk tube. 5 ml of dimethyl sulfoxide are added and the reaction mixture is stirred at 60° C. for 2 hours, then at 80° C. for 2 hours and at 110° C. for a further 5 hours. The solvent is removed under reduced pressure at 70° C., and the solid which precipitates is washed with a little methanol and tetrahydrofuran and then dried. This forms a white solid 31.

Empirical formula: C$_{21}$H$_{20}$N$_4$PtBr$_2$ M=683.296 g/mol

Yield: 0.205 g (73.5% of theory)

Melting point: decomposition at >260° C.

$^1$H (ppm, d$_6$-DMSO, 300.13 MHz):

δ=7.54 (d, 2H, J=2.0 Hz, NCHCHN); 7.30 (s, 10H, arom. CH); 7.23 (d, 2H, J=1.9 Hz, NCHCHN); 6.15 (AB, 1H, J=13.1 Hz, NCH$_2$N); 6.06 (AB, 1H, J=13.0 Hz, NCH$_2$N); 6.08 (AB, 2H, J=14.7 Hz, NCH$_2$Ph); 5.28 (AB, 2H, J=14.7 Hz, NCH$_2$Ph).

M) (1,1'-Di-(2,4,6-trimethylphenyl)-3,3'-methylenediimidazoline-2,2'-diylidene)-platinum(II) dibromide 32

Reference: Strassner, Th. et al.; Synthesis, Structure and Stability of New Pt$^{II}$-Bis(N-Heterocyclic Carbene) Complexes. *Eur. J. Inorg. Chem.* 2006, 1268-1274

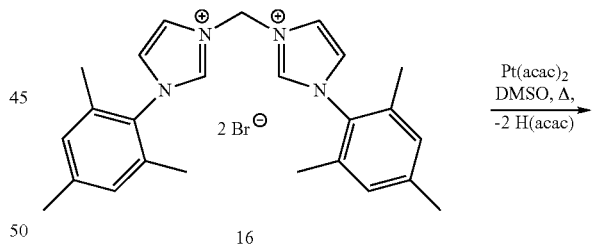

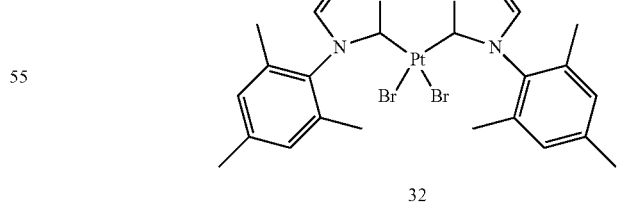

0.5 mmol of platinum(II) acetylacetonate (0.197 g) are combined with 0.5 mmol of 1,1'-di(2,4,6-trimethylphenyl)-3,3'-methylenediimidazolium dibromide 16 (0.273 g) in a Schlenk tube. 5 ml of dimethyl sulfoxide are added and the reaction mixture is stirred at 80° C. for 2 hours, then at 100° C. for 2 hours and at 130° C. for a further 2 hours. The solvent is removed under reduced pressure at 70° C., and the solid which precipitates is washed with a little methanol and tetrahydrofuran and then dried. This forms a white solid 32.

Empirical formula: $C_{25}H_{28}N_4PtBr_2$ M=739.400 g/mol

Yield: 0.158 g (42.7% of theory)

Melting point: decomposition at >400° C.

$^1$H (ppm, $d_6$-DMSO, 300.13 MHz):

δ=7.78 (s, 2H, NCHCHN); 7.29 (s, 2H, NCHCHN); 6.89 (d, 4H, J=12.6 Hz, arom. CH); 6.32 (AB, 1H, J=13.1 Hz, NCH$_2$N); 6.15 (AB, 1H, J=13.1Hz, NCH$_2$N); 2.26 (s, 6H, para-CH$_3$); 2.08 (s, 6H, ortho-CH$_3$); 2.00 (s, 6H, ortho-CH$_3$).

N) (1,1'-Di-(2,4,6-trimethylphenyl)-3,3'-methylene-diimidazoline-2,2'-diylidene)-platinum(II) diiodide 33

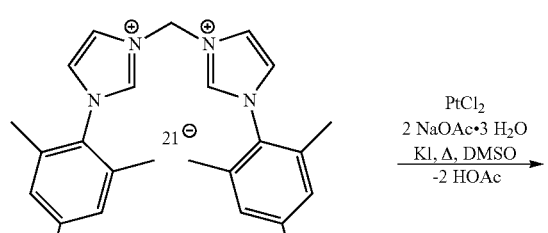

0.31 mmol of platinum(II) chloride (0.083 g) and 0.31 mmol of 1,1'-di-(2,4,6-tri-methylphenyl)-3,3'-methylenediimidazolium diiodide 17 (0.200 g), and also 0.62 mmol of sodium acetate trihydrate (0.084 g) and 0.62 mmol of potassium iodide (0.103 g), are stirred with 4 ml of dimethyl sulfoxide in a Schlenk tube at 80° C. for 2 hours, at 100° C. for 2 hours and at 130° C. for a further 2 hours. The solvent is then removed at 70° C. under reduced pressure, and the solid formed is washed with methanol and tetrahydrofuran and dried. This forms a white solid 33.

Empirical formula: $C_{25}H_{28}N_4PtI_2$ M=833.392 g/mol

Yield: 0.215 g (83.2% of theory)

Melting point: decomposition at >370° C.

$^1$H (ppm, $d_6$-DMSO, 300.13 MHz):

δ=7.80 (d, 2H, J=1.9 Hz, NCHCHN); 7.32 (d, 2H, J=1.9 Hz, NCHCHN); 6.94 (s, 4H, arom. CH); 6.33 (AB, 1H, J=13.1 Hz, NCH$_2$N); 6.15 (AB, 1H, J=13.0 Hz, NCH$_2$N); 2.27 (s, 6H, para-CH$_3$); 2.08 (s, 6H, ortho-CH$_3$); 2.04 (s, 6H, ortho-CH$_3$).

O) (1,1'-Di-(2,4,6-trimethylphenyl)-3,3'-methylene-diimidazoline-2,2'-diylidene)-platinum(II) diacetate 34

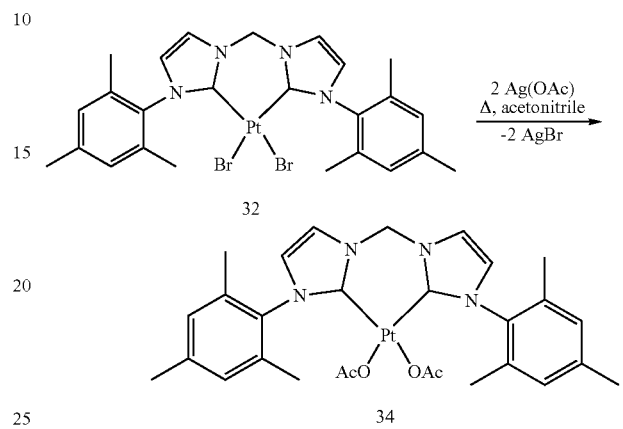

0.27 mmol of silver acetate (0.045 g) in 5 ml of acetonitrile are added to 0.135 mmol of (1,1'-di-(2,4,6-trimethylphenyl)-3,3'-methylenediimidazoline-2,2'-diylidene)platinum(II) dibromide 32 (0.100 g). The mixture is stirred at 60° C. with the exclusion of light for 8 hours. The silver bromide which precipitates and unconverted reactants are filtered off, and the solvent is removed under reduced pressure. This forms a white solid 34.

Empirical formula: $C_{29}H_{34}N_4O_4Pt$ M=697.680 g/mol

Yield: 0.027 g (28.7% of theory)

$^1$H (ppm, $d_6$-DMSO, 300.13 MHz):

δ=7.81 (s, 2H, NCHCHN); 7.34 (s, 2H, NCHCHN); 6.96 (s, 4H, arom. CH); 6.37 (AB, 1H, J=13.1 Hz, NCH$_2$N); 2.27 (s, 6H, para-CH$_3$); 2.02 (s, 12H, ortho-CH$_3$); 1.20 (s, 6H, CH$_3$COO).

P) (1,1'-Dimethyl-3,3'-o-phenylenedimethylenediimidazoline-2,2'-diylidene)-platinum(II) dichloride 35

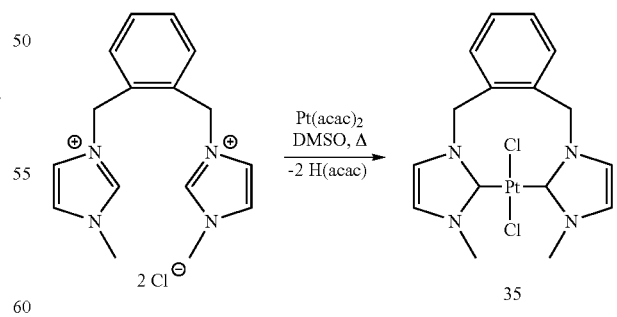

0.737 mmol of 1,1'-dimethyl-3,3'-o-phenylenedimethylenediimidazolium dichloride (0.250 g) are combined with 0.737 mmol of platinum(II) acetylacetonate (0.290 g) and 7 ml of dimethyl sulfoxide. The reaction mixture is stirred at 80° C. for 3 hours, at 100° C. for 3 hours and at 120° C. for a further 4 hours. The dimethyl sulfoxide is removed at 70° C.

under reduced pressure and the remaining solid is washed twice with 3 ml of methanol each time. A white solid 35 is obtained.

Empirical formula: $C_{16}H_{18}N_4PtCl_2$ M=532.322 g/mol

Yield: 0.272 g (69.3% of theory)

Melting point: decomposition at >390° C.

$^1$H (ppm, $d_6$-DMSO, 300.13 MHz):

δ=7.85 (m, 2H, J=3.5 Hz, arom. CH groups); 7.59 (d, 2H, J=2.0 Hz, NCHCHN); 7.42 (m, 2H, J=3.5 Hz, arom. CH groups); 7.24 (d, 2H, J=2.0 Hz, NCHCHN); 6.60 (AB, 2H, J=14.2 Hz, NCH$_2$C$_6$H$_4$—CH$_2$N); 5.00 (AB, 2H, J=14.2 Hz, NCH$_2$C$_6$H$_4$—CH$_2$N); 3.88 (s, 6H, CH$_3$ group)

4.2 Homoleptic Tetracarbene Complexes

A) Bis(1,1-dimethyl-3,3'-methylenediimidazoline-2,2'-diylidene)palladium(II) diiodide 36

(Fehihammer, W. P. et al.; Homoleptic carbene complexes. VI. bis{1,1'-methylene-3,3'-dialkyldimidazoline-2,2'-diylidene}palladium chelate complexes by the free carbene route. *Journal of Organometallic Chemistry* 1995, 490, (1-2), 149-153; Herrmann, W. A. et al.; N-heterocyclic carbenes. 20. Homoleptic chelating N-heterocyclic carbene complexes of palladium and nickel. *Journal of Organometallic Chemistry* 1999, 575, (1), 80-86)

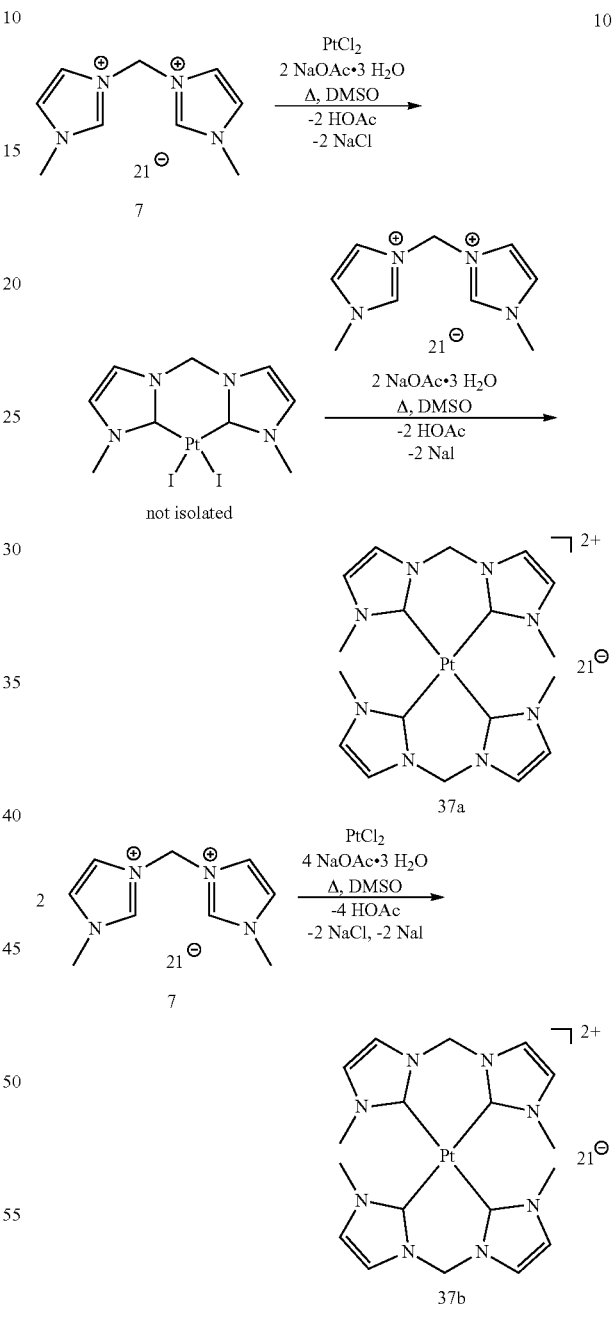

0.25 mmol of palladium(II) acetate (0.056 g) and 0.625 mmol of 1,1'-dimethyl-3,3'-methylenediimidazolium diiodide 7 (0.270 g), and 0.5 mmol of sodium acetate trihydrate (0.068 g), are stirred with 6 ml of dimethyl sulfoxide in a Schlenk tube at 60° C. for 2 hours, at 80° C. for 2 hours and at 110° C. for 1 hour. Another 0.5 mmol of sodium acetate trihydrate (0.068 g) is added at 110° C. and the mixture is stirred at 110° C. for a further 5 hours. The solvent is then removed at 70° C. under reduced pressure and the resulting solid is washed with a little water, a little cold methanol and tetrahydrofuran and dried. This forms a white solid 36.

Empirical formula: $C_{18}H_{24}N_8PdI_2$ M=712.672 g/mol

Yield: 0.096 g (53.9% of theory)

Melting point: decomposition at >347° C.

$^1$H (ppm, $d_6$-DMSO, 300.13 MHz):

δ=7.75 (d, 4H, J=1.8 Hz, NCHCHN); 7.44 (d, 4H, J=1.8 Hz, NCHCHN); 6.75 (AB, 2H, J=13.1 Hz, NCH$_2$N); 6.50 (AB, 2H, J=13.1 Hz, NCH$_2$N); 3.37 (s, 12H, CH$_3$ group).

B) Bis-(1,1'-dimethyl-3,3'-methylenediimidazoline-2,2'-diylidene)platinum(II) diiodide 37a,b Method A:

0.5 mmol of platinum(II) chloride (0.133 g) and 0.5 mmol of 1,1'-dimethyl-3,3'-methylenediimidazolium diiodide 7 (0.216 g), and 1 mmol of sodium acetate trihydrate (0.136 g), are stirred with 5 ml of dimethyl sulfoxide in a Schienk tube at 60° C. for 3 hours, at 80° C. for 3 hours and at 110° C. for a further 3 hours. At room temperature, another 0.75 mmol of 1,1'-dimethyl-3,3'-methylenediimidazolium diiodide 7 (0.324 g) and 1 mmol of sodium acetate trihydrate (0.136 g) are then added to the reaction mixture. The above temperature program is again performed. The solvent is then removed at 70° C. under reduced pressure and the resulting solid is washed with 10 ml of water and 5 ml of tetrahydrofuran and dried. This forms a white solid 37a.

Method B:

0.25 mmol of platinum(II) chloride (0.066 g) and 0.625 mmol of 1,1'-dimethyl-3,3'-methylenediimidazolium diiodide 7 (0.270 g), and 0.5 mmol of sodium triacetate trihydrate (0.068 g), are stirred with 5 ml of dimethyl sulfoxide in a Schlenk tube at 60° C. for 2 hours, at 80° C. for 2 hours and at 110° C. for 1 hour. Another 0.5 mmol of sodium acetate trihydrate (0.068 g) is added at 110° C. and the mixture is stirred at 110° C. for a further 5 hours. The solvent is then removed under reduced pressure at 70° C. and the solid formed is washed with 10 ml of water and 5 ml of tetrahydrofuran and dried. This forms a white solid 37b.

The analysis for both 37a and 37b gave the results listed below.

Empirical formula: $C_{18}H_{24}N_5PtI_2$ M=801.330 g/mol
Yield: Method A: 0.320 g (79.9% of theory)
Method B: 0.137 g (68.4% of theory)
Melting point: decomposition at >360° C.
$^1$H (ppm, $d_6$-DMSO, 300.13 MHz):
δ=7.75 (d, 4H, J=1.8 Hz, NCHCHN); 7.47 (d, 4H, J=1.8 Hz, NCHCHN); 6.54 (AB, 2H, J=13.2 Hz, NCH$_2$N); 6.43 (AB, 2H, J=13.2 Hz, NCH$_2$N); 3.32 (s, 12H, CH$_3$ group).

C) Bis-(1,1'-diisopropyl-3,3'-methylenediimidazoline-2,2'-diylidene)-palladium(II) diiodide 38

(Albrecht, M. et al.; Synthesis and structural analysis of palladium biscarbene complexes derived from bisimidazolium ligand precursors. *Inorg. Chim. Acta* 359 (2006), 1929-1938)

0.61 mmol of 1,1'-diisopropyl-3,3'-methylenediimidazolium diiodide 9 (0.300 g) is stirred with 1.54 mmol of triethylamine (0.155 g; 0.21 ml) in 5 ml of dimethyl sulfoxide at room temperature for 30 min. 0.305 mmol of palladium(II) diacetate (0.069 g) are added and the mixture is stirred at room temperature for a further 3 hours. The mixture is then stirred at 50° C. for 18 hours and at 150° C. for 1 hour. The dimethyl sulfoxide is removed at 70° C. under reduced pressure, and the remaining solid is washed twice with 2 ml of water each time and twice with 2 ml of methanol each time and dried. An ochre solid 38 is obtained.

Empirical formula: $C_{26}H_{40}N_8PdI_2$ M=824.88 g/mol
Yield: 0.110 g (43.7% of theory)
Melting point: decomposition at >342° C.
$^1$H (ppm, $d_6$-DMSO, 300.13 MHz):
δ=7.80 (d, 4H, J=1.8 Hz, NCHCHN); 7.63 (d, 4H, J=1.8 Hz, NCHCHN); 6.59 (AB, 2H, J=13.6 Hz, NCH$_2$N); 6.49 (AB, 2H, J=13.4 Hz, NCHN); 3.88 (sept, 4H, J=6.6 Hz (CH$_3$)$_2$CHN); 1.26 (d, 12H, J=6.8 Hz, CH$_3$ group); 1.15 (d, 12H, J=6.6 Hz, CH$_3$ group);

D) Bis-(1,1'-diisopropyl-3,3'-methylenediimidazoline-2,2'-diylidene)platinum(II) diiodide 39a,b

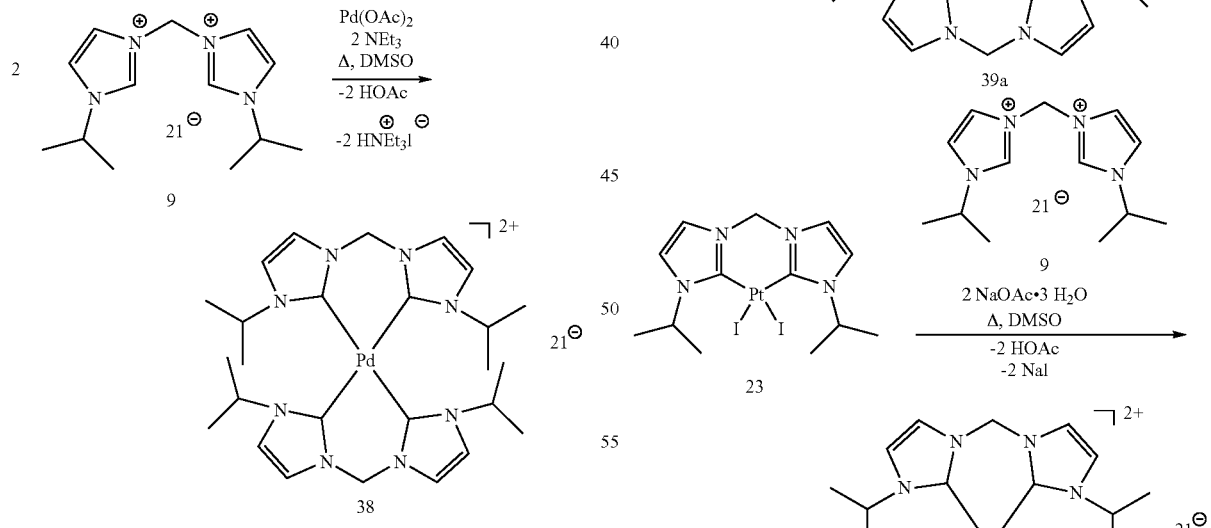

Method A:

0.22 mmol of (1,1'-diisopropyl-3,3'-methylenediimidazoline-2,2'-diylidene)-platinum(II) diacetate 24 (0.120 g) are admixed with 0.22 mmol of 1,1'-diisopropyl-3,3'-methylenediimidazolium diiodide 9 (0.107 g), dissolved in 4 ml of dimethyl sulfoxide and stirred at 60° C. for 2 hours, at 80° C. for 2 hours and at 110° C. for a further 5 hours. The dimethyl sulfoxide is removed at 70° C. under reduced pressure and the remaining solid is washed twice with 3 ml of water each time. A white solid 39a is obtained.

Method B:

0.10 mmol of (1,1'-diisopropyl-3,3'-methylenediimidazoline-2,2'-diylidene)-platinum(II) diiodide 23 (0.070 g) and 0.10 mmol of 1,1'-diisopropyl-3,3'-methylenediimidazolium diiodide 9 (0.050 g) are dissolved together with 0.20 mmol of sodium acetate trihydrate (0.027 g) in 3 ml of dimethyl sulfoxide. The mixture is stirred at 60° C. for 2 hours, at 80° C. for 2 hours and at 110° C. for a further 5 hours. The dimethyl sulfoxide is removed under reduced pressure at 70° C. and the remaining solid is washed twice in a methanol-tetrahydrofuran mixture. A white solid 39b is obtained. The analysis for both 39a and 39b gave the results listed below.

Empirical formula: $C_{26}H_{40}N_8PtI_2$ M=913.538 g/mol

Yield: Method A: 0.060 g (29.9% of theory)

Method B: 0.020 g (21.9% of theory)

Melting point: decomposition at >350° C.

$^1$H (ppm, $d_6$-DMSO, 300.13 MHz):

δ=7.80 (d, 4H, J=1.8 Hz, NCHCHN); 7.67 (d, 4H, J=1.9 Hz, NCHCHN); 6.52 (AB, 2H, J=13.5 Hz, NCH$_2$N); 6.33 (AB, 2H, J=13.4 Hz, NCH$_2$N); 3.90 (sept, 4H, J=6.6 Hz (CH$_3$)$_2$CHN); 1.28 (d, 12H, J=6.8 Hz, CH$_3$ group); 1.12 (d, 12H, J=6.6 Hz, CH$_3$ group);

E) Bis-(1,1'-diisopropyl-3,3'-methylenediimidazoline-2,2'-diylidene)platinum(II) dibromide 40

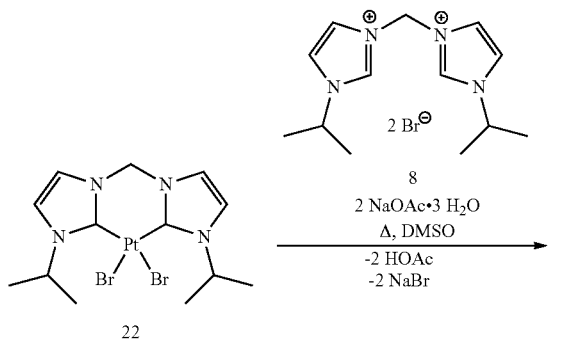

0.14 mmol of (1,1'-diisopropyl-3,3'-methylenediimidazoline-2,2'-diylidene)-platinum(II) dibromide 22 (0.080 g) and 0.14 mmol of 1,1'-diisopropyl-3,3'-methylenediimidazolium bromide 8 (0.054 g) are dissolved in 4 ml of dimethyl sulfoxide together with 0.28 mmol of sodium acetate trihydrate (0.037 g). The mixture is stirred at 60° C. for 2 hours, at 80° C. for 2 hours and at 110° C. for a further 5 hours. The dimethyl sulfoxide is removed at 70° C. under reduced pressure and the remaining solid is washed twice in a methanol-tetrahydrofuran mixture. A white solid 40 is obtained.

Empirical formula: $C_{26}H_{40}N_8PtBr_2$ M=819.546 g/mol

Yield: 0.034 g (28.6% of theory)

Melting point: decomposition at >390° C.

$^1$H (ppm, $d_6$-DMSO, 300.13 MHz):

δ=7.86 (s, 4H, NCHCHN); 7.70 (s, 4H, NCHCHN); 6.64 (AB, 2H, J=13.3 Hz, NCH$_2$N); 6.35 (AB, 2H, J=13.3 Hz, NCH$_2$N); 3.91 (sept, 4H, J=6.6 Hz (CH$_3$)$_2$CHN); 1.29 (d, 12H, J=6.7 Hz, CH$_3$ group); 1.14 (d, 12H, J=6.6 Hz, CH$_3$ group);

F) Bis-(1,1'-di-n-butyl-3,3'-methylenediimidazoline-2,2'-diylidene)platinum(II) diiodide 41

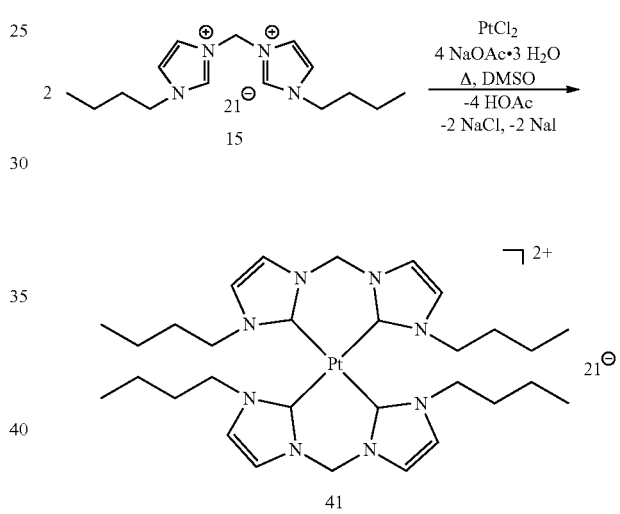

0.5 mmol of platinum(II) chloride (0.133 g) and 1.25 mmol of 1,1'-di-n-butyl-3,3'-methylenediimidazolium diiodide 15 (0.645 g), and 1 mmol of sodium acetate trihydrate (0.136 g), are stirred with 8 ml of dimethyl sulfoxide in a Schlenk tube at 60° C. for 2 hours, at 80° C. for 2 hours and at 110° C. for 1 hour. Another 1 mmol of sodium acetate trihydrate (0.136 g) is added at 110° C. and the mixture is stirred at 110° C. for a further 5 hours. The solvent is then removed under reduced pressure at 70° C. and the resulting solid is washed twice with 3 ml each time of methanol and 3 ml of tetrahydrofuran and dried. This forms a white solid 41.

Empirical formula: $C_{30}H_{48}N_8PtI_2$ M=969.642 g/mol

Yield: 0.136 g (28.1% of theory)

Melting point: decomposition at >370° C.

$^1$H (ppm, $d_6$-DMSO, 300.13 MHz):

δ=7.87 (s, 4H, NCHCHN); 7.63 (s, 4H, NCHCHN); 6.80 (AB, 2H, J=13.4 Hz, NCH$_2$N); 6.17 (AB, 2H, J=13.3 Hz, NCH$_2$N); 3.81 (m, 4H, J=6.8 Hz, N—CH$_2$—CH$_2$—CH$_2$—CH$_3$); 3.23 (m, 4H, J=6.9 Hz, N—CH—CH$_2$—CH$_2$—CH$_3$); 1.56 (quint, 8H, J=7.2 Hz, N—CH$_2$—CH$_2$—CH$_2$—CH$_3$); 0.98

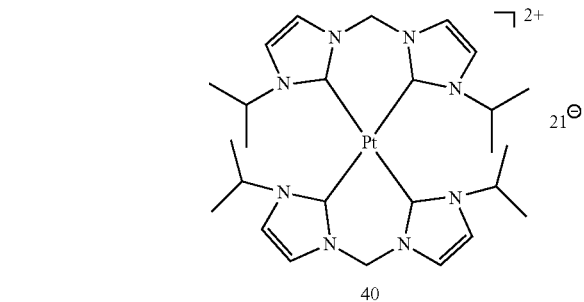

(sext, 8H, J=7.4 Hz, N—CH$_2$—CH$_2$—CH$_2$—CH$_3$); 0.70 (t, 12H, J=7.2 Hz, N—CH$_2$—CH$_2$—CH$_3$)

G) Bis-(1,1'-dicyclohexyl-3,3'-methylenediimidazoline-2,2'-diylidene)-platinum(II) diiodide 42

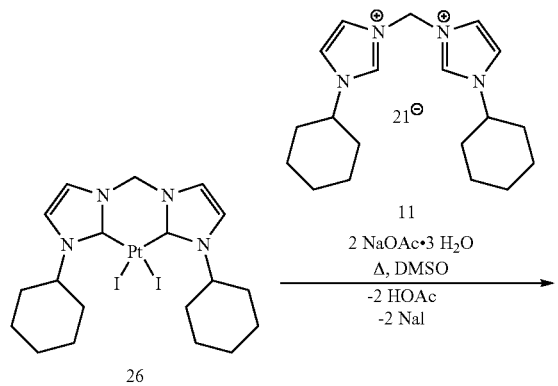

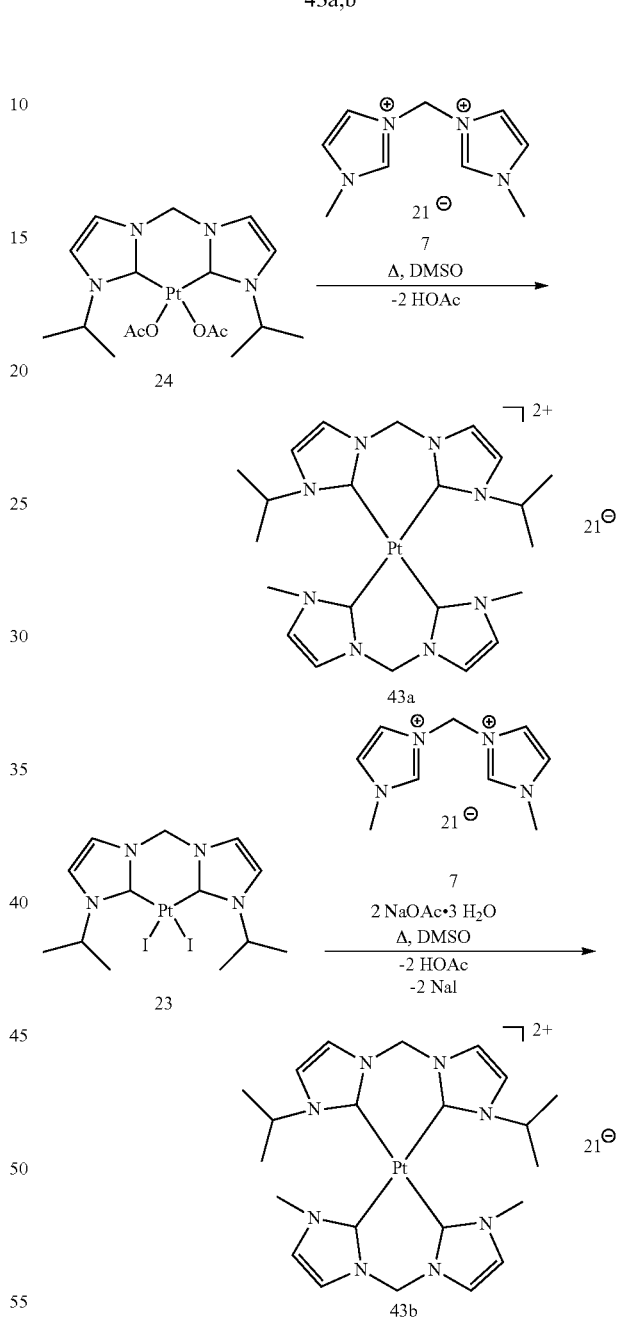

0.105 mmol of (1,1'-dicyclohexyl-3,3'-methylenediimidazoline-2,2'-diylidene)-platinum(II) diiodide 26 (0.080 g) and 0.105 mmol of 1,1'-dicyclohexyl-3,3'-methylenediimidazolium diiodide 11 (0.060 g) are dissolved in 4 ml of dimethyl sulfoxide together with 0.21 mmol of sodium acetate trihydrate (0.029 g). The mixture is stirred at 60° C. for 2 hours, at 80° C. for 2 hours and at 110° C. for a further 5 hours. The dimethyl sulfoxide is removed under reduced pressure at 70° C. and the remaining solid is washed twice in a methanol/tetrahydrofuran mixture. A white solid 42 is obtained.

Empirical formula: C$_{38}$H$_{56}$N$_8$Pt$_2$ M=1073.786 g/mol

Yield: 0.228 g (24.8% of theory)

Melting point: decomposition at >393° C.

$^1$H (ppm, d$_6$-DMSO, 300.13 MHz):

δ=7.89 (s, 4H, NCHCHN); 7.70 (s, 4H, NCHCHN); 6.68 (AB, 2H, J=13.4 Hz, NCH$_2$N); 6.11 (AB, 1H, J=13.7 Hz, NCH$_2$N); 3.34 (t, 4H, J=11.8 Hz, CH of cyclohexyl ring); 1.81 (d, 8H, J=12.1 Hz, CH$_2$ of cyclohexyl ring; 1.68 (d, 4H, J=11.7 Hz, CH$_2$ of cyclohexyl ring); 1.35 (d, 8H, J=11.5 Hz, CH$_2$ of cyclohexyl ring); 1.15 (t, 8H, J=11.9 Hz, CH$_2$ of cyclohexyl ring); 0.84 (t, 8H, J=12.1 Hz, CH$_2$ of cyclohexyl ring)

4.3 Heteroleptic tetracarbene complexes

A) (1,1'-Diisopropyl-3,3'-methylenediimidazoline-2,2'-diylidene)(1'',1'''-dimeth-yl-3'',3'''-methylenediimidazoline-2'',2'''-diylidene)platinum(II) diiodide 43a,b Method A:

0.13 mmol of (1,1'-diisopropyl-3,3'-methylenediimidazoline-2,2'-diylidene)-platinum(II) diacetate 24 (0.070 g) are admixed with 0.13 mmol of 1,1'-dimethyl-3,3'-methylenediimidazolium diiodide 7 (0.055 g), dissolved in 3 ml of dimethyl sulfoxide and stirred at 60° C. for 2 hours, at 80° C. for 2 hours and at 110° C. for a further 5 hours. The dimethyl sulfoxide is removed under reduced pressure at 70° C. and the remaining solid is washed twice with 1 ml each time of methanol. A white solid 43a is obtained.

Method B:

0.13 mmol of (1,1'-diisopropyl-3,3'-methylenediimidazoline-2,2'-diylidene)-platinum(II) diiodide 23 (0.089 g) is dissolved in 3 ml of dimethyl sulfoxide together with 0.13 mmol of 1,1'-dimethyl-3,3'-methylenediimidazolium diiodide 7 (0.055 g) and 0.26 mmol of sodium acetate trihydrate, and stirred at 60° C. for 2 hours, at 80° C. for 2 hours and at 110° C. for a further 5 hours. The dimethyl sulfoxide is removed at 70° C. under reduced pressure and the solid formed is washed twice with 1 ml each time of methanol. A white solid 43b is obtained.

The analysis for 43a and 43b both gave the results listed below.
Empirical formula: $C_{22}H_{32}N_8PtI_2$ M=857.434 g/mol
Yield: Method A: 0.039 g (35.0% of theory)
Method B: 0.017 g (15.3% of theory)
Melting point: decomposition at >360° C.
$^1$H (ppm, $d_6$-DMSO, 300.13 MHz):
δ=7.80 (d, 2H, J=1.8 Hz, NCHCHN); 7.75 (d, 2H, J=1.8 Hz, NCHCHN); 7.71 (d, 2H, J=1.9 Hz, NCHCHN); 7.47 (d, 2H, J=1.7 Hz, NCHCHN); 6.58 (AB, 1H, J=13.1 Hz, NCH$_2$N); 6.47 (AB, 1H, J=13.6 Hz, NCH$_2$N); 6.43 (AB, 1H, J=13.3 Hz, NCH$_2$N); 6.35 (AG, 1H, J=13.4 Hz, NCH$_2$N); 3.97 (sept, 2H, J=6.6 Hz (CH$_3$)$_2$CHN); 3.29 (s, 6H, CH$_3$ group); 1.28 (d, 6H, J=6.8 Hz, CH$_3$ group); 1.10 (d, 6H, J=6.6 Hz, CH$_3$ group)

B) (1,1'-Dicyclohexyl-3,3'-methylenediimidazoline-2,2'-diylidene)(1",1'''-diisopropyl-3",3'''-methylenediimidazoline-2",2'''-diylidene)platinum(II) diiodide 44

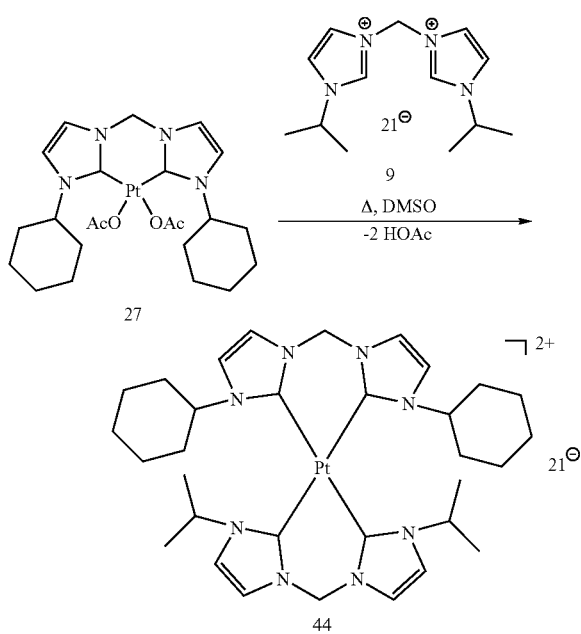

0.16 mmol of (1,1'-dicyclohexyl-3,3'-methylenediimidazoline-2,2'-diylidene)-platinum(II) diacetate 27 (0.100 g) are dissolved in 4 ml of dimethyl sulfoxide together with 0.16 mmol of 1,1'-diisopropyl-3,3'-methylenediimidazolium diiodide 9 (0.078 g), and stirred at 60° C. for 2 hours, at 80° C. for 2 hours and at 110° C. for a further 5 hours. The dimethyl sulfoxide is removed at 70° C. under reduced pressure and the solid formed is washed twice in a methanol-tetrahydrofuran mixture. A white solid 44 is obtained.
Empirical formula: $C_{32}H_{48}N_8PtI_2$ M=993.662 g/mol
Yield: 0.087 g (54.7% of theory)
Melting point: decomposition at >343° C.
$^1$H (ppm, $d_6$-DMSO, 300.13 MHz):
δ=7.88 (d, 2H, J=1.8 Hz, NCHCHN); 7.80 (d, 2H, J=2.0 Hz, NCHCHN); 7.73 (d, 2H, J=2.0 Hz, NCHCHN); 7.63 (d, 2H, J=1.8 Hz, NCHCHN); 6.60 (AB, 1H, J=13.5 Hz, NCH$_2$N); 6.51 (AB, 1H, J=13.4 Hz, NCH$_2$N); 6.39 (AB, 1H, J=13.5 Hz, NCH$_2$N); 6.05 (AB, 1H, J=13.3 Hz, NCH$_2$N); 3.98 (sept, 2H, J=6.6 Hz, (CH$_3$)$_2$CHN); 3.25 (t, 2H, J=11.9 Hz, CH$_2$ of cyclohexyl ring); 1.85 (d, 4H, J=12.4 Hz, CH$_2$ of cyclohexyl ring); 1.75 (d, 4H, J=11.3 Hz, CH$_2$ of cyclohexyl ring); 1.68 (d, 4H, J=11.4 Hz, CH$_2$ of cyclohexyl ring); 1.55 (t, 4H, J=11.9 Hz, CH$_2$ of $^i$prop); 1.12 (t, 4H, J=12.0 Hz, CH$_2$ of cyclohexyl ring)

C) (1,1'-Diisopropyl-3,3'-methylenediimidazoline-2,2'-diylidene)(1",1'''-di-n-butyl-3",3'''-methylenediimidazoline-2",2'''-diylidene)platinum(II) diiodide 45

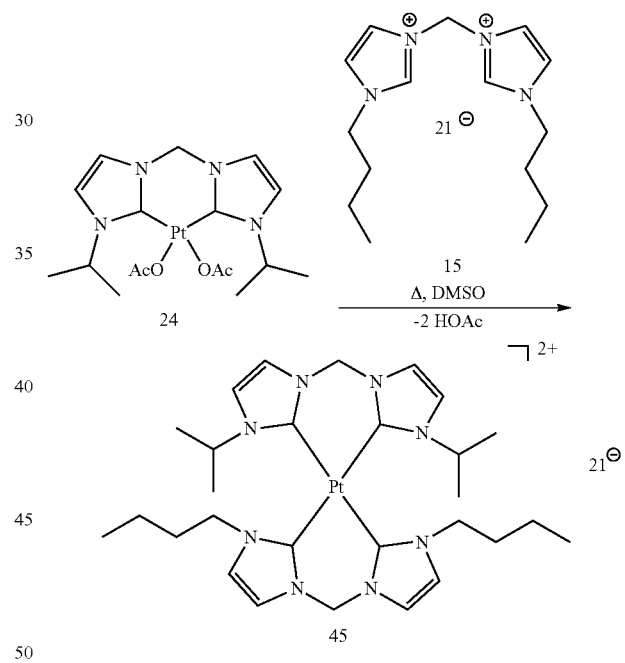

0.18 mmol of (1,1'-diisopropyl-3,3'-methylenediimidazoline-2,2'-diylidene)-platinum(II) diacetate 24 (0.100 g) are dissolved in 4 ml of dimethyl sulfoxide together with 0.18 mmol of 1,1'-di-n-butyl-3,3'-methylenediimidazolium diiodide 15 (0.094 g), and stirred at 60° C. for 2 hours, at 80° C. for 2 hours and at 110° C. for a further 5 hours. The dimethyl sulfoxide is removed at 70° C. under reduced pressure and the solid formed is washed twice in a methanol-tetrahydrofuran mixture. A white solid 45 is obtained.
Empirical formula: $C_{28}H_{44}N_8PtI_2$ M=941.590 g/mol
Yield: 0.085 g (50.2% of theory)
Melting point: decomposition at >347° C.
$^1$H (ppm, $d_6$-DMSO, 300.13 MHz):
δ=7.89 (s, 2H, NCHCHN); 7.84 (s, 2H, NCHCHN); 7.81 (s, 2H, NCHCHN); 7.64 (s, 2H, NCHCHN); 6.59 (AB, 1H, J=13.5 Hz, NCH$_2$N); 6.56 (AB, 1H, J=13.2 Hz, NCH$_2$N);

6.43 (AB, 1H, J=13.4 Hz, NCH$_2$N); 6.20 (AB, 1H, J=13.3 Hz, NCH$_2$N); 4.00 (sept, 2H, J=6.6 Hz, (CH$_3$)$_2$CHN); 3.89 (m, 2H, J=6.6 Hz, N—CH$_2$—CH$_2$—CH$_2$—CH$_3$); 3.24 (m, 2H, J=6.6 Hz, N—CH$_2$—CH$_2$—CH$_2$—CH$_3$); 1.57 (quint, 4H, J=7.2 Hz, N—CH$_2$—CH$_2$—CH$_2$—CH$_3$); 1.31 (d, 6H, J=6.7 Hz, CH$_3$ of $^i$prop); 1.17 (d, 6H, J=6.5 Hz, CH$_3$ of $^i$prop); 0.97 (sext, 4H, J=6.9 Hz, N—CH$_2$—CH$_2$—CH$_2$—CH$_3$); 0.78 (t, 6H, J=7.2 Hz, N—CH$_2$—CH$_2$—CH$_3$)

D) (1,1'-Dicyclohexyl-3,3'-methylenediimidazoline-2,2'-diylidene)(1'',1'''-dimethyl-3'',3'''-methylenediimidazoline-2'',2'''-diylidene)platinum(II) diiodide 46

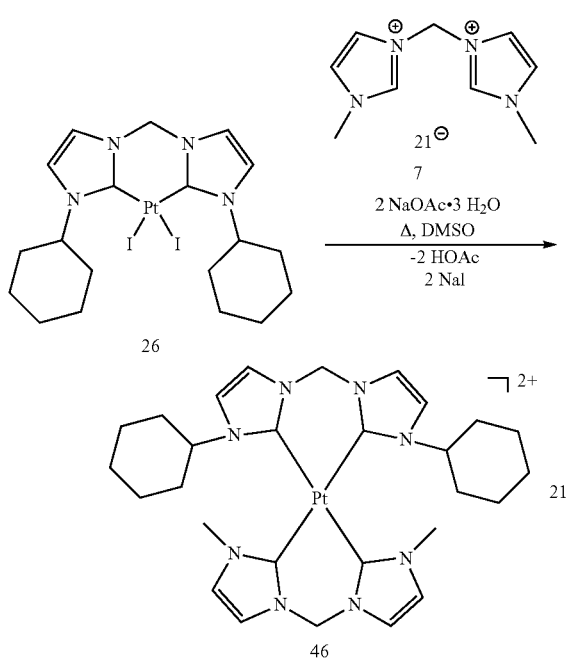

0.11 mmol of (1,1'-dicyclohexyl-3,3'-methylenediimidazoline-2,2'-diylidene)-platinum(II) diiodide 26 (0.080 g) are dissolved in 3 ml of dimethyl sulfoxide together with 0.11 mmol of 1,1'-dimethyl-3,3'-methylenediimidazolium diiodide 7 (0.045 g) and 0.21 mmol of sodium acetate trihydrate (0.029 g), and stirred at 60° C. for 2 hours, at 80° C. for 2 hours and at 110° C. for a further 5 hours. The dimethyl sulfoxide is removed at 70° C. under reduced pressure and the solid formed is washed twice in a methanol-tetrahydrofuran mixture. A white solid 46 is obtained.

Empirical formula: C$_{28}$H$_{40}$N$_8$PtI$_2$ M=937.558 g/mol
Yield: 0.065 g (63.0% of theory)
Melting point: decomposition at >375° C.
$^1$H (ppm, d$_6$-DMSO, 300.13 MHz):
δ=7.84 (s, 2H, NCHCHN); 7.81 (s, 2H, NCHCHN); 7.67 (s, 2H, NCHCHN); 7.52 (s, 2H, NCHCHN); 6.66 (AB, 1H, J=13.2 Hz, NCH$_2$N); 6.63 (AB, 1H, J=13.4 Hz, NCH$_2$N); 6.52 (AB, 1H, J=13.2 Hz, NCH$_2$N); 6.15 (AB, 1H, J=13.4 Hz, NCH$_2$N); 3.59 (t, 2H, J=12.5 Hz, CH of cyclohexyl ring); 3.35 (s, 6H, CH$_3$ of Me); 1.85 (d, 4H, J=12.5 Hz, CH$_2$ of cyclohexyl ring; 1.76 (d, 4H, J=10.1 Hz, CH$_2$ of cyclohexyl ring); 1.67 (d, 4H, J=10.9 Hz, CH$_2$ of cyclohexyl ring); 1.37 (t, 4H, J=9.5 Hz, CH$_2$ of cyclohexyl ring); 1.12 (t, 4H, J=9.6 Hz, CH$_2$ of cyclohexyl ring)

E) (1,1'-dibenzyl-3,3'-methylenediimidazoline-2,2'-diylidene)(1'',1'''-dimethyl-3'',3'''-methylenediimidazoline-2'',2'''-diylidene)platinum(II) dibromide 47

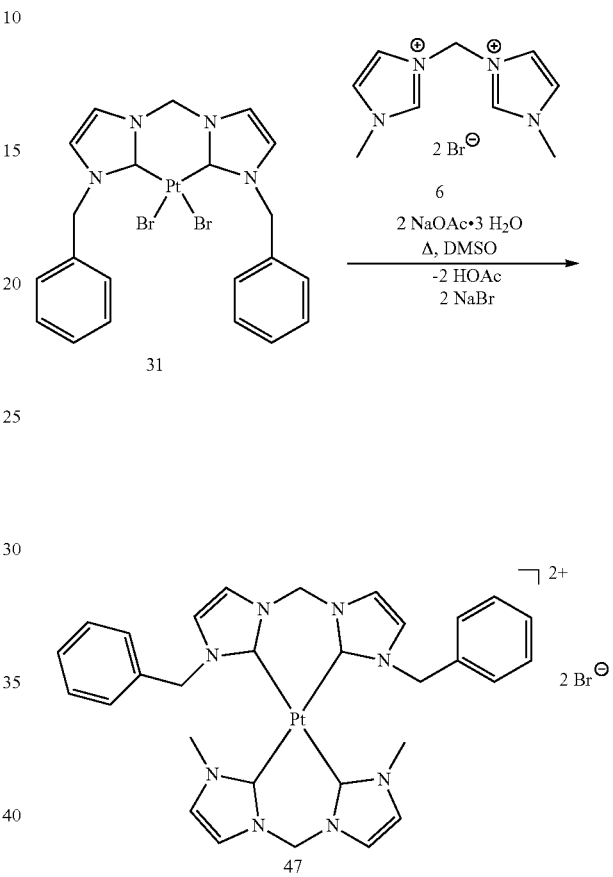

0.12 mmol of (1,1'-dibenzyl-3,3'-methylenediimidazoline-2,2'-diylidene)platinum(II) dibromide 31 (0.080 g) are combined with 0.12 mmol of 1,1'-dimethyl-3,3'-methylenediimidazolium dibromide 6 (0.040 g) and 0.24 mmol of sodium acetate trihydrate (0.033 g) in a Schlenk tube. 4 ml of dimethyl sulfoxide are added and the reaction mixture is stirred at 60° C. for 2 hours, then at 80° C. for 2 hours and at 110° C. for a further 5 hours. The solvent is removed under reduced pressure at 70° C., and the solid which precipitates is washed twice in a methanol-tetrahydrofuran mixture and dried. This forms a white solid 47.

Empirical formula: C$_{30}$H$_{32}$N$_8$PtBr$_2$ M=859.522 g/mol
Yield: 0.028 g (27.1% of theory)
Melting point: decomposition at >341° C.
$^1$H (ppm, d$_6$-DMSO, 300.13 MHz):
δ=7.79 (d, 2H, J=1.0 Hz, NCHCHN); 7.77 (d, 2H, J=1.8 Hz, NCHCHN); 7.51 (d, 2H, J=1.9 Hz, NCHCHN); 7.47 (d, 2H, J=1.8 Hz, NCHCHN); 7.28 (s, 6H, J=7.4 Hz, arom. CH); 7.08 (d, 4H, J=6.1 Hz, arom. CH); 6.68 (AB, 1H, J=13.1 Hz, NCH$_2$N); 6.51 (Ab, 1H, J=13.1 Hz, NCH$_2$N); 6.48 (AB, 1H, J=13.4 Hz, NCH$_2$N); 6.23 (AB, 1H, J=13.4 Hz, NCH$_2$N); 5.03 (AB, 1H, J=14.3 Hz, NCH$_2$Ph); 4.63 (AB, 2H, J=14.3 Hz, NCH$_2$Ph); 3.33 (s, 6H, CH$_3$).

F) (1,1'-Di-(2,4,6-trimethylphenyl)-3,3'-methylenediimidazoline-2,2'-diylidene)-(1'',1'''-dimethyl-3'',3'''-methylenediimidazoline-2'',2'''-diylidene)platinum(II) dibromide 48

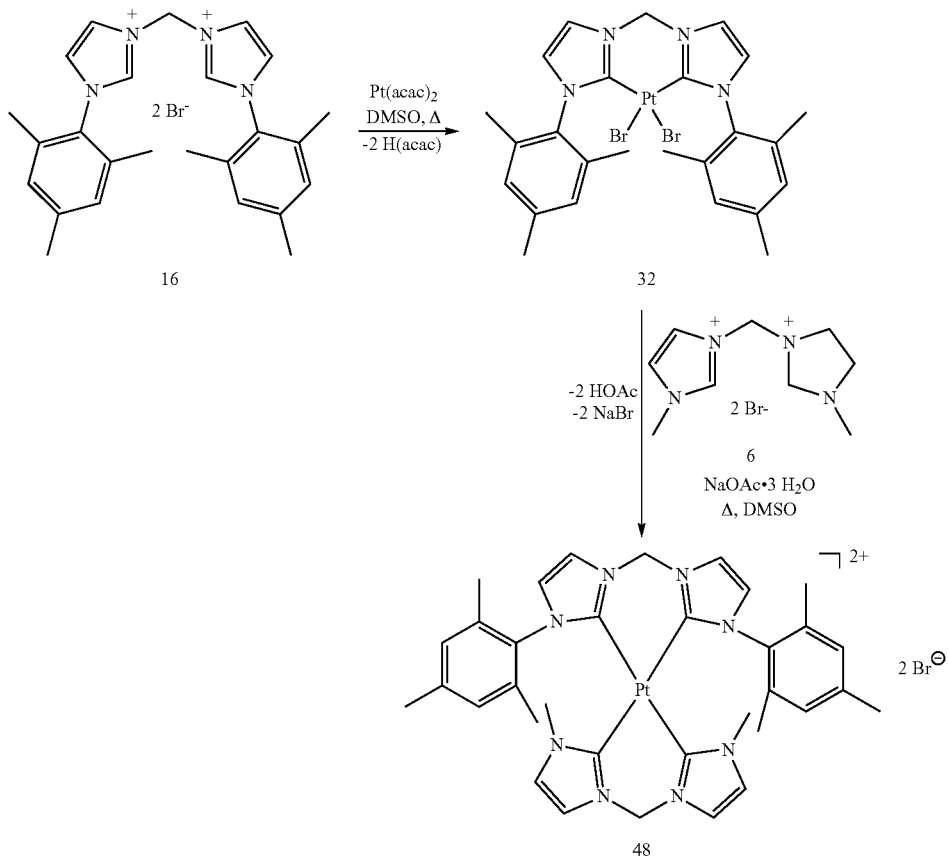

0.55 mmol of platinum(II) acetylacetonate (0.216 g) and 0.55 mmol of 1,1'-di-(2,4,6-trimethylphenyl)-3,3'-methylenediimidazolium dibromide 16 (0.300 g) are stirred with 5 ml of dimethyl sulfoxide in a Schlenk tube at 80° C. for 2 hours, at 100° C. for 2 hours and at 130° C. for a further 2 hours. The reaction mixture is cooled to 60° C. 0.275 mmol of 1,1'-dimethyl-3,3'-methylenediimidazolium dibromide 6 (0.093 g) and 0.55 mmol of sodium acetate trihydrate (0.075 g) are added to the reaction mixture and rinsed in with 2 ml of dimethyl sulfoxide. The mixture is stirred at 60° C. for 2 hours, at 80° C. for 14 hours, at 110° C. for 4 hours and at 130° C. for 2 hours. The solvent is then removed under reduced pressure at 70° C., and the solid formed is washed with a methanol-tetrahydrofuran mixture and dried under reduced pressure. This forms a white solid 48.

| Empirical formula: | $C_{34}H_{40}N_8PtBr_2$ |
|---|---|
| Molar mass: | 915.626 g/mol |
| Yield: | 0.082 g (32.6% of theory) |
| Melting point: | decomposition at >400° C. |

$^1$H (ppm, d$_6$-DMSO, 300.13 MHz):
δ=7.78 (s, 2H, NCHCHN of Mes ligand); 7.75 (s, 2H, NCHCHN of Me ligand); 7.48 (s, 2H, NCHCHN of Me ligand); 7.28 (s, 2H, NCHCHN of Mes ligand); 6.92 (s, 2H, arom. CH); 6.87 (s, 2H, arom. CH); 6.55 (AB, 1H, J=13.1 Hz, NCH$_2$N of Me ligand); 6.44 (AB, 1H, J=13.1 Hz, HCH$_2$N of Me ligand); 6.33 (AB, 1H, J=13.0 Hz, NCH$_2$N of Mes ligand); 6.15 (AB, 1H, J=12.9 Hz, NCH$_2$N of Mes ligand); 3.32 (s, 6H, CH$_3$ of Me ligand); 2.26 (s, 6H, p-CH$_3$); 2.08 (s, 6H, o-CH$_3$); 2.00 (s, 6H, o-CH$_3$).

Photoluminescence Data

In order to further characterize the inventive transition metal-carbene complexes in a diluted solid, corresponding PVA films comprising 2% by weight of the particular transition metal complex in PVA are prepared. For the PVA film, in each case 2 mg of transition metal-carbene complex (37b, 42, 44, 45, 46) are dissolved per 1 ml of 10% (percent by mass) of PVA solution (PVA in demineralized water (DM water)) and a 60 μm doctor blade is used to spread a film onto a microscope slide (quartz glass). The film is then dried. The photoluminescence data of the corresponding transition metal-carbene complexes are determined on the films obtained.

Table 1 summarizes the photoluminescence quantum yields (QY) and the color coordinates ($X_{RGB}$ and $Y_{RGB}$) of selected transition metal-carbene complexes of the general formula II (2% by weight of the particular transition metal complex in PVA (polyvinyl alcohol) films on quartz glass):

| Example | Ex [nm]$^{1)}$ | $X_{RGB}$$^{2)}$ | $Y_{RGB}$$^{3)}$ | EM [nm]$^{4)}$ | QY$^{5)}$ |
|---|---|---|---|---|---|
| 37b | 307 | 0.165 | 0.072 | 386 | 45 |
| 44 | 307 | 0.174 | 0.114 | 386 | 7 |

-continued

| Example | Ex [nm][1] | $X_{RGB}$[2] | $Y_{RGB}$[3] | EM [nm][4] | QY[5] |
|---|---|---|---|---|---|
| 45 | 307 | 0.171 | 0.105 | 386 | 40 |
| 46 | 307 | 0.168 | 0.087 | 387 | 39 |
| 42 | 307 | 0.174 | 0.121 | 386 | 6 |

[1] Excitation wavelength
[2] CIE coordinates at room temperature
[3] CIE coordinates at room temperature
[4] Emission wavelength
[5] Quantum yield, irradiation under $N_2$

The invention claimed is:

1. An organic light-emitting diode comprising a least one transition metal-carbene complex selected from transition metal-carbene complexes of the general formulae I and II.

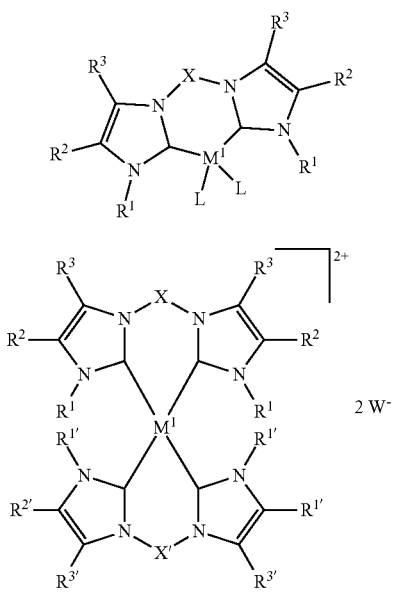

in which the symbols are each defined as follows:
$M^1$ is Pt(II), Pd(II);
L is a monodentate monoanionic ligand;
$R^1$, $R^1$
    are each independently hydrogen, alkyl, cycloalkyl, aryl, heteroaryl, aralkyl;
$R^2$, $R^3$, $R^{2'}$, $R^{3'}$
    are each independently hydrogen, alkyl, aryl;
X, X' are each independently alkylene,

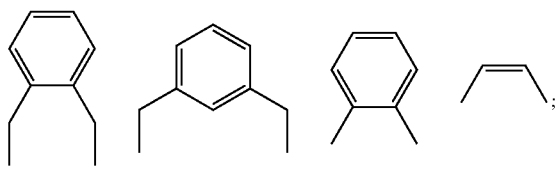

$W^-$ is a monoanionic counterion,
    wherein the transition metal-carbene complexes of the formulae (I) and (II) do not have any cyclometallation of the carbene ligands via a further carbon atom or heteroatom.

2. The organic light-emitting diode according to claim 1, wherein the symbols and radicals $R^1$, $R^2$, $R^3$, $R^{1'}$, $R^{2'}$, $R^{3'}$X, X', $M^1$, L and $W^-$ in the transition metal-carbene complexes of the formulae I and II are each defined as follows:
$M^1$ is Pt(II), Pd(II);
L are each independently selected from halides, pseudohalides$^-$, alkoxy and OAc$^-$,
$R^1$, $R^{1'}$,
    are each independently hydrogen, $C_1$-$C_4$-alkyl, cyclohexyl, 2,4,6-trimethylphenyl or benzyl;
$R^2$, $R^3$, $R^{2'}$, $R^{3'}$
    are each hydrogen;
X, X' are each independently $(CR^4_2)_n$,

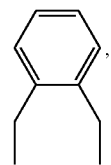

where $R^4$ is H, alkyl and n is from 1 to 3;
$W^-$ is halide, pseudohalide or OAc$^-$.

3. The organic light-emitting diode according to claim 1, wherein a transition metal-carbene complex of the general formula I is used in which:
$M^1$ is Pt(II), Pd(II);
X is $CH_2$,

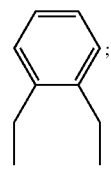

$R^1$ is $CH_3$, isopropyl, n-butyl, cyclohexyl, benzyl, 2,4,6-trimethylphenyl;
L is Br$^-$, I$^-$, OAc$^-$.

4. The organic light-emitting diode according to claim 1, wherein a homoleptic transition metal-carbene complex of the general formula II is used in which:
$M^1$ is Pt(II), Pd(II);
X, X'
    are each $CH_2$;
$R^1$, $R^{1'}$
    are each $CH_3$, isopropyl, n-butyl, cyclohexyl, benzyl or 2,4,6-trimethylphenyl;
$W^-$ is Br$^-$ or I$^-$.

5. The organic light-emitting diode according to claim 1, wherein a heteroleptic transition metal-carbene complex of the general formula II is used in which:
$M^1$ is Pt(II), Pd(II);
X, X'
    are each $CH_2$;
$R^1$, $R^{1'}$
    are each independently methyl, isopropyl, n-butyl, benzyl, cyclohexyl, 2,4,6-trimethylphenyl, where the definitions of $R^1$ and $R^{1'}$ may be different;
$R^2$, $R^3$, $R^{2'}$, $R^{3'}$
    are each H;
$W^-$ is Br$^-$ or I$^-$.

6. The organic light-emitting diode according to claim 1, wherein the at least one transition metal-carbene complex of the general formula I and/or II is present in the light-emitting layer, a blocking layer for electrons, a blocking layer for electrons and/or a blocking layer for holes.

7. A light-emitting layer comprising at least one transition metal-carbene complex of the general formulae I and/or II according to claim 1.

8. An organic light-emitting diode comprising at least one light-emitting layer according to claim 7.

9. A device selected from the group consisting of stationary visual display units such as visual display units of computers, televisions, visual display units in printers, kitchen appliances, and also advertising panels, illuminations, information panels and mobile visual display units such as visual display units in cellphones, laptops, digital cameras, vehicles and destination displays on buses and trains, comprising at least one organic light-emitting diode according to claim 1.

* * * * *